United States Patent [19]
Ohkawa et al.

[11] Patent Number: 5,708,276
[45] Date of Patent: Jan. 13, 1998

[54] ELECTRON-BEAM EXPOSURE DEVICE AND A METHOD OF DETECTING A MARK POSITION FOR THE DEVICE

[75] Inventors: Tatsuro Ohkawa; Kawakami Kenichi; Yoshihisa Ooae; Tohru Ikeda; Kazushi Ishida, all of Kawasaki, Japan

[73] Assignee: Fujitsu Limited, Kawasaki, Japan

[21] Appl. No.: 600,456

[22] Filed: Feb. 13, 1996

[30] Foreign Application Priority Data

Jul. 20, 1995 [JP] Japan .................. 7-184232

[51] Int. Cl.⁶ .................. H01J 37/304
[52] U.S. Cl. .................. 250/491.1; 257/797
[58] Field of Search .................. 250/491.1; 257/797

[56] References Cited

U.S. PATENT DOCUMENTS

| | | |
|---|---|---|
| 3,901,814 | 8/1975 | Davis et al. .................. 250/491.1 |
| 4,443,704 | 4/1984 | Yamashita et al. .................. 250/491.1 |
| 5,285,075 | 2/1994 | Minamide et al. .................. 250/491.1 |

FOREIGN PATENT DOCUMENTS

| | | |
|---|---|---|
| 58-067027 | 4/1983 | Japan . |
| 62-29136 | 2/1987 | Japan .................. 250/491.1 |
| 01-268122 | 10/1989 | Japan . |
| 04-105312 | 4/1992 | Japan . |
| 04-359506 | 12/1992 | Japan . |

*Primary Examiner*—Jack I. Berman
*Attorney, Agent, or Firm*—Staas & Halsey

[57] ABSTRACT

An electron-beam exposure device having at least one deflector for deflecting an electron beam and detecting a position of a position-detection mark with the electron beam includes a plurality of detectors detecting electrons scattered from the position-detection mark, a plurality of amplifiers, each of the amplifiers amplifying an output of a corresponding one of the detectors, and a setting unit for setting amplification factors of the amplifiers such that a magnitude of an output from each of the amplifiers is constant irrespective of a deflected position of the electron beam at a time of detection of the position of the position-detection mark.

34 Claims, 16 Drawing Sheets

FIG. 2B OUTPUT OF 200

FIG. 2C OUTPUT OF 201

FIG. 2D ADDED SIGNAL

ELECTRON-BEAM EXPOSURE DEVICE AND A METHOD OF DETECTING A MARK POSITION FOR THE DEVICE

BACKGROUND OF THE INVENTION

1. Field of the Invention

The present invention generally relates to an electron-beam exposure device, and particularly relates to a mark-position detection technique for positional alignment in the electron-beam exposure device.

2. Description of the Prior Art

As an integration density of semiconductor integrated circuits increases, a finer processing technique is required. The electron-beam exposure technique has extremely superior characteristics in terms of image resolution and depth of a focal point, compared to the photolithography technique widely used in the manufacturing of LSI chips. For example, the photolithography technique can achieve an image resolution of 0.3 µm, whereas the electron-beam exposure technique can achieve an image resolution finer than 0.1 µm.

However, the electron-beam exposure technique has inferior characteristics in terms of a positional accuracy of exposure, a superimposing accuracy, an inter-field-connection accuracy, and the like, compared to the photolithography technique. Thus, the electron-beam exposure technique is not yet widely used for mass-production purposes.

Electron-beam exposure devices generally have a smaller deflection field than do optical exposure devices such as a stepper, where the deflection field is a field for which total exposure can be performed at one time. Thus, in order to expose one LSI chip, the LSI chip must be shifted by a stage movement such that deflection field can be positioned at various locations over the LSI chip. In this case, a low accuracy of the connection between the deflection fields may result in severance of wires or a short-circuit, thereby significantly degrading the yield rate.

An improvement of the yield rate entails an enhancement in the connection accuracy between the fields, which inevitably requires a deflection accuracy of the electron beam. In general, a magnetic field generated by coils is used for deflecting the electron beam in the electron-beam exposure device.

Two coils are generally provided for x-direction deflection and y-direction deflection, respectively. Separate electric currents are applied to each coil to deflect the beam in the x direction end the y direction. Unfortunately, an extent of the beam deflection is not proportional to the amount of the electric current applied to the coils, but is a complex function of the electric current.

Thus, an improvement of accuracy in the electron-beam deflection requires a correction of an electric current input to a deflector (coils). There are two types of corrections. One is a distortion correction for realizing a linear relation between the input amount and the deflection amount, and the other is a deflection—rate correction for correcting proportion factors.

The distortion correction is a time-consuming process since it requires data collection at every predetermined point within a field. Fortunately, however, there is little temporal change in the distortion, so that once the data is collected, there is no need to collect the data again.

On the other hand, correction coefficients for the deflection-rate correction can be obtained in a short period of time. Yet, the correction coefficients must be obtained relatively frequently, since the deflection rate changes due to a change in thermal distribution in the deflector.

In order to calibrate the deflection field, coordinates of the deflector are generally matched with coordinates of a stage, which are guaranteed of scale measure and orthogonality by means of a laser interference optical system. In order to measure the deflection-unit coordinates, it is necessary to know an actual deflected position of an electron-beam by detecting a mark position on a wafer with the electron beam.

FIGS. 1A through 1C are illustrative drawings for explaining a method of detecting a mark position by electron-beam scanning. As shown in FIGS. 1A and 1B, an electron beam is scanned by a deflector over a range which includes a mark formed on a wafer. Scattered-electron detectors 200 through 203 which are arranged around a central axis of the optical system detect electrons scattered by the mark. Outputs of the scattered-electron detectors 200 through 203 are added at an adder 204.

A signal obtained by the addition is provided to a video amplifier 205, and a resulting signal is measured in synchronism with the scanning of the deflector. If the process described above is performed by using a position-detection mark as shown in FIG. 1A, scattered-electron signals as shown in FIG. 1C are obtained. The scattered-electron signals obtained in this manner are used for detecting a center position of the mark.

The reason why the outputs of the scattered-electron detectors 200 and 201 are added is because these outputs have an asymmetric form as illustratively shown in FIG. 1C. This asymmetry is observed when an engraved mark as shown in FIG. 1A is used, and how this asymmetry is created will be explained below.

FIGS. 2A through 2C are illustrative drawings for explaining how this asymmetry is created.

As shown in FIG. 2A, when the electron beam scans over a left edge of the engraved mark, the electron beam scattered by the side wall of the mark is detected. As a result, a large output of the scattered-electron detector 201 is obtained. In this situation, many electrons do not reach the scattered-electron detector 200 since they are obstructed by the side wall. As a result, the output of the scattered-electron detector 200 is small.

When the electron beam is scanned slightly to the right in FIG. 2A to be positioned on the bottom of the engraved mark, most of the electrons are obstructed by the side wall on the left. As a result, the output of the scattered-electron detector 200 becomes a minimum.

As the electron beam is scanned further toward the center of the mark, the output of the scattered-electron detector 200 gradually increases. When the electron beam scans over a right edge of the mark, the phenomenon which occurred for the left edge occurs in the same manner with a reversed effect between the right-hand side and the left-hand side. Consequently, the scattered-electron signals as shown in FIGS. 2B and 2C are obtained from the scattered-electron detectors 200 and 201, respectively.

It is difficult to determine mark-edge positions through signal processing from these asymmetrical forms. FIG. 2D is an illustrative drawing showing a signal obtained by adding these two signals. As shown FIG. 2D, two signals (four signals in actuality) from the scattered-electron detectors on the right-hand side and the left-hand side are added to obtain a symmetrical signal form. This symmetrical signal form is used for determining the mark position.

The mark-position detection described above is carried out at various locations by shifting the position of the mark formed on the wafer through a stage movement. In this manner, a distortion map and the deflection-rate correction coefficients are obtained for a deflector.

However, the above-described method of detecting the mark position has a problem in that the detected mark positions end up containing errors.

When a mark position is detected at various locations on a plane, solid angles of the four detectors viewed from the mark will differ depending on the position of the mark relative to the detectors. Also, a scattering angle of the electron beam reaching the detectors will differ depending on the position of the mark relative to the detectors.

FIGS. 3A and 3B are illustrative drawings for explaining a difference in the solid angles of the detectors.

When marks are positioned ±1 mm from the center of a deflection field in a configuration of detectors as shown in FIG. 3A, solid angles of the scattered-electron detector 201 viewed from a mark on the right-hand side and a mark on the left-hand side differ from each other by 20 to 40%.

Since sensitivities of the detectors depend on these solid angles, detectors having different solid angles end up having different output magnitudes. Thus, even when the output signals from the detectors are added, an asymmetry remains in the added signal. Also, there are other causes for the asymmetry in the added signal, such causes including a product variation in the sensitivity of the detectors and errors in the positioning of detectors.

Such an asymmetry in the added signal is a main cause of errors in the detection of mark positions. It is shown that when the amplification factor of one of the detectors is changed instead of the solid angles being changed, a detected position is off by 0.01 µm to 0.02 µm for a change in the amplification factor by 20 to 40% (equivalent to a change in the solid angle by 20 to 40%).

Such errors in detected mark positions can be corrected by creating a map of errors which are generated at each position of mark detection. However, this correction is only achievable when a shape of the mark is always the same. However, the detection of mark positions is conducted not only for collecting the data of the deflection-rate correction, but also for positioning patterns when patterning is conducted in a semiconductor process.

In consideration of a diversity of materials and shapes of marks used in the semiconductor process, the use of an error map is an ineffective method of correcting errors.

Accordingly, in the detection of mark positions for positioning in an electron-beam exposure device, there is a need for an electron-beam exposure device and a method which can detect mark positions accurately.

SUMMARY OF THE INVENTION

Accordingly, it is a general object of the present invention to provide an electron-beam exposure device and a method which can satisfy the need described above.

It is another and a more specific object of the present invention to provide an electron-beam exposure device and method which can detect mark positions accurately.

An electron-beam exposure device having at least one deflector for deflecting an electron beam and detecting a position of a position-detection mark with the electron beam includes a plurality of detectors detecting electrons scattered from the position-detection mark, a plurality of amplifiers, each of the amplifiers amplifying an output of a corresponding one of the detectors, and a setting unit for setting amplification factors of the amplifiers such that a magnitude of an output from each of the amplifiers is constant irrespective of a deflected position of the electron beam at a time of detection of the position of the position-detection mark.

In the electron-beam exposure device described above, the magnitudes of the outputs from the amplifiers are independent of a position of the position-detection mark when the electron beam is positioned on the position detection mark. Thus, errors in the position detection caused by an asymmetry in the added signal are eliminated to provide a precise detection of the position-detection mark.

Other objects and further features of the present invention will be apparent from the following detailed description when read in conjunction with the accompanying drawings.

BRIEF DESCRIPTION OF THE DRAWINGS

FIGS. 2A through 2D are illustrative drawings for explaining how an asymmetry is created in a detected signal;

DESCRIPTION OF THE PREFERRED EMBODIMENTS

Figure 1A:
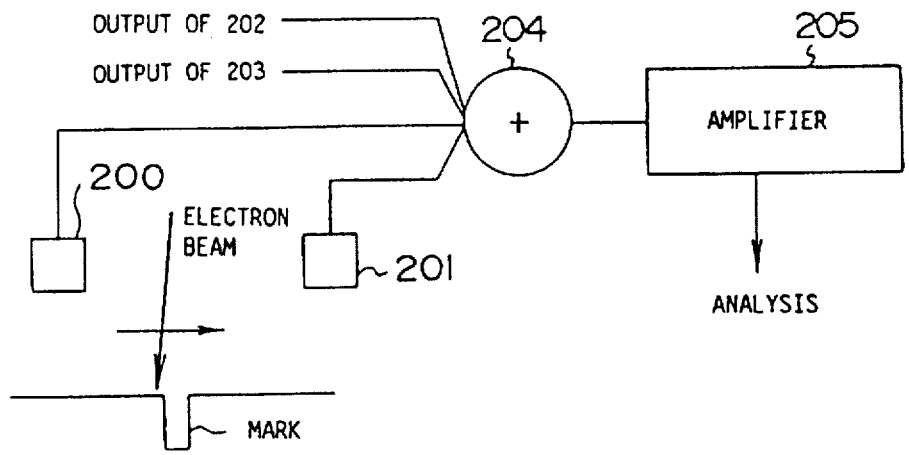
FIGS. 1A through 1C are illustrative drawings for explaining a method of detecting a mark position by electron-beam scanning.
Figure 1B:
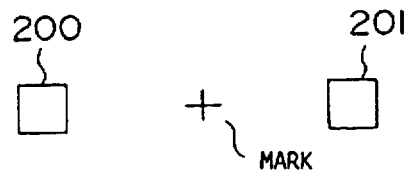
Figure 1C:
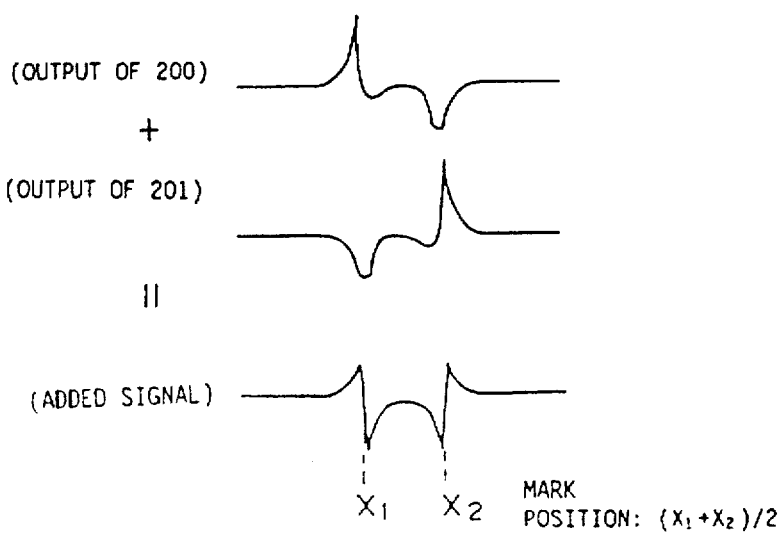
Figure 2A:
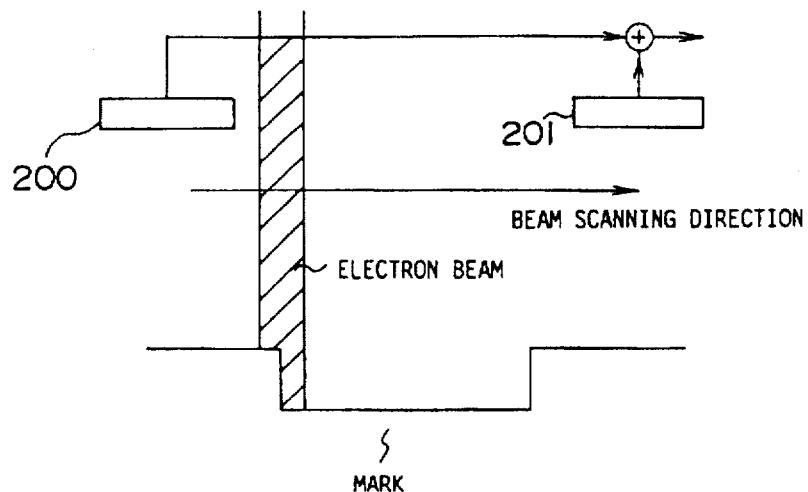
Figure 2A:
Figure 2A:
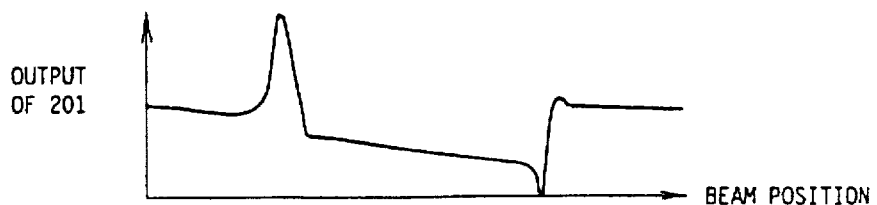
Figure 2A:
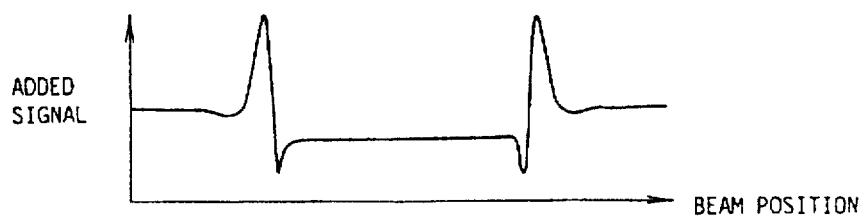
Figure 3A:
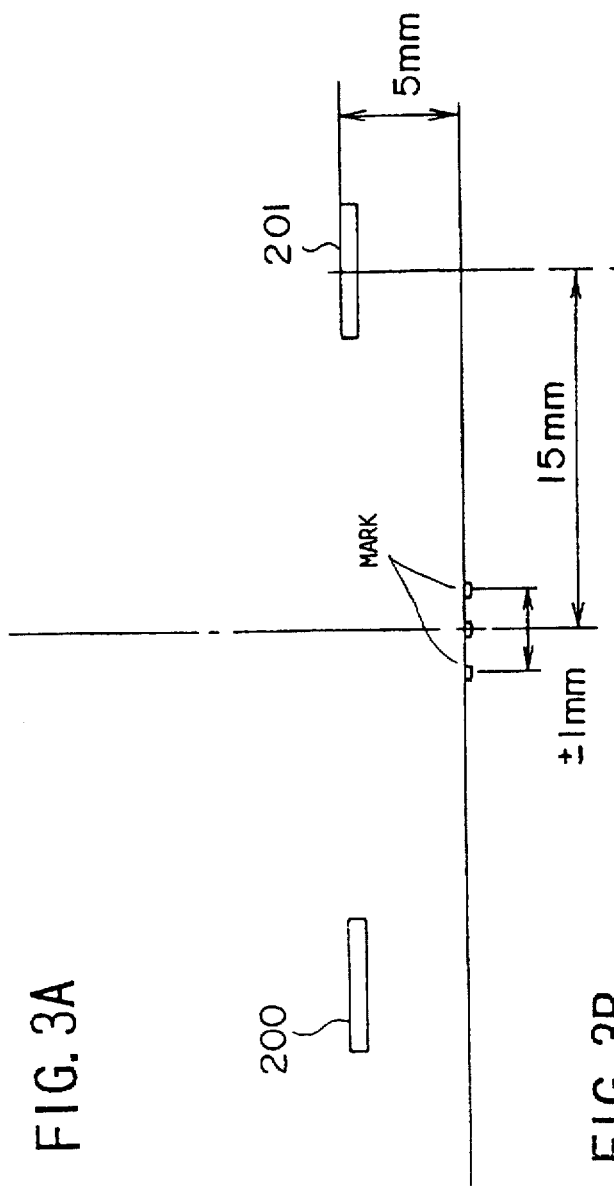
FIGS. 3A and 3B are illustrative drawings for explaining a difference in a solid angle of a detector.
Figure 3B:
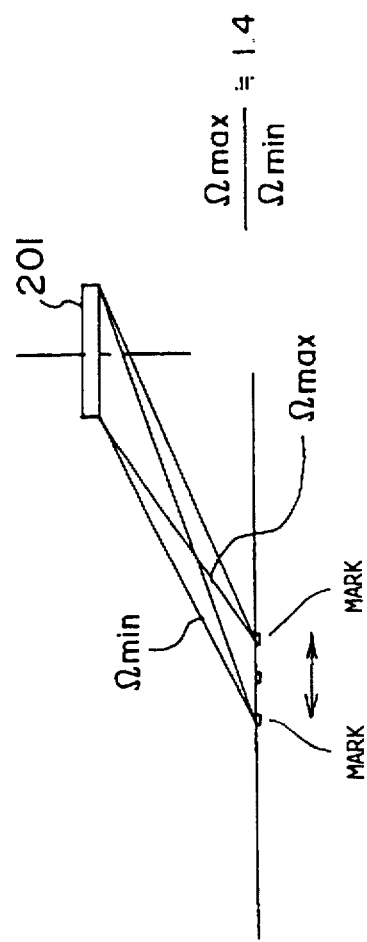

In the following, principles and embodiments of the present invention will be described with reference to the accompanying drawings.

A first principle of the present invention will be described below.

According to the first principle of the present invention, an amplification factor of an amplifier connected to a detector is changed in accordance with a position of a deflected electron beam in a deflection field, so that a magnitude of an output from the detector does not change irrespective of changes in a mark position. Keeping the magnitude of the output from each detector constant in this manner can avoid an asymmetry in an added signal form, which asymmetry would otherwise appear depending on the mark position.

The amplification factor which keeps the magnitude of the detector output constant can be calculated as follows.

In order to keep the magnitude of the detector output constant, it is necessary to compensate for a change in a signal-output magnitude I which is caused by a change in a solid angle of a detector viewed from an incident point. Since the signal-output magnitude I is proportional to a solid angle $\Omega$, the signal-output magnitude I is represented as:

$$I = \Omega/\Omega_o \cdot I_o \tag{1}$$

where $I_O$ represents a magnitude of a signal at a reference level, and $\Omega_O$ represents a solid angle viewed from a reference position such as a position of the electron-beam axis. Let $G_O$ be an amplification factor used in an amplifier when the incident point is at the reference position. Then, an amplification factor G of the amplifier, $$G = \Omega_o/\Omega \cdot G_o \tag{2}$$

can keep the output from the detector at a constant magnitude.

If a change in a view angle is excluded from a calculation of the solid angle, the solid angle $\Omega$ is in proportion to $1/r^2$, where r is a distance between the detector and the incident point. Then, the amplification factor G is represented in a simple form as:

$$G = (r^2)/(r_o^2) \cdot G_o \tag{3}$$

where $r_O$ is a reference distance. For example, the reference distance may be a distance between the detector and the position of the electron-beam axis.

The precise calculation of the solid angle often requires a complex calculation. In reality, outputs from detectors can change due to factors other than the solid angles. In such a case, it is necessary to obtain a position-dependent characteristic of an output of each detector within a deflection field, in order to incorporate various factors affecting the output.

In order to quantitatively measure the position-dependent characteristic within the deflection field, a beam having a constant shape is deflected to a position X on a flat wafer having no mark or the like. Scattered electrons are detected by an i-th scattered-electron detector, and a signal output $V_i(X)$ after an amplification by an amplifier having a predetermined reference amplification factor is obtained. Here, X represents a vector indicating a position on a two dimensional plane. By using a reference amplification factor $g_{io}$ and a sensitivity of the detector $E_i(X)$ which is dependent on various factors, the signal output $V_i(X)$ is represented as:

$$V_i(X) = g_{io} \cdot E_i(X) \cdot (\text{amount of scattered electrons})$$

Here, the amount of scattered electrons in the case of a flat wafer can be assumed to be constant regardless of a deflection position X. From the equation (4), the sensitivity $E_i(X)$ dependent on various factors is represented as:

$$E_i(X) = V_i(X)/(g_{io} \cdot (\text{amount of scattered electrons})) \tag{5}$$

Thus, measuring the signal output $V_i(X)$ at various locations provides the sensitivity $E_i(X)$ at those locations.

A variable amplification factor $g_i(X)$ used in the position detection is obtained as a reciprocal of the sensitivity $E_i(X)$:

$$g_i(X) = 1/E_i(X) \tag{6}$$
$$= g_{io} \cdot (\text{amount of scattered electrons})/V_i(X)$$

Use of this variable amplification factor $g_i(X)$ can cancel out a sensitivity variation originating from the various factors. Namely, a signal output independent of the position X can be obtained by using the variable amplification factor $g_i(X)$. Also, a signal obtained by adding outputs of a plurality of detectors does not change.

In the equation (6), the amount of scattered electrons is the same for different detectors, so that it can be replaced by an appropriate constant value for all the detectors. Since the equation (6) takes into account real amplification factors of amplifiers which are set to a reference amplification factor, differences in the amplification factors are also dealt with.

If there is no need to take into account the differences in the amplification factors, $g_{io}$ can be replaced by an appropriate constant value which is the same for all the amplifiers. Alternately, the output of the detector, instead of the output of the amplifier, can be used as the signal output $V_i(X)$. When the detector output is used as the signal output $V_i(X)$, the variable amplification factor $g_i(X)$ is represented as:

$$g_i(X) = V_{io}/V_i(X) \tag{7}$$

where $V_{io}$ is a signal output of the detector when the incident point is at a reference position such as a position of the electron-beam axis.

The first principle, according to which the amplification factor is set to keep the amplifier outputs at a constant level irrespective of the deflection position, can also be achieved in the following manner without using the calculation described above. First, the beam is deflected to a point on a wafer in a proximity of the position of mark detection, and illuminates a flat surface of the wafer. Here, it is desirable that the flat surface has a high electron reflectivity. Then, the amplification factors of amplifiers are set such that all outputs of the amplifiers become equal to a reference voltage level. By setting the amplification factors in this manner, it is possible to make equal all the outputs of the amplifiers in a proximity of the mark position.

According to the first principle of the present invention, the output magnitude of the amplifiers are independent of mark positions. Thus, the magnitude of the output signal from the scattered-electron detectors become constant, so that the asymmetry in the added signal form caused by the dependency on the mark position can be avoided.

In the following, a first embodiment of the first principle of the present invention will be described. In the first embodiment, the calculation of the amplification factors shown in the equation (2), the equation (3), the equation (6), or the equation (7) can be used.

Figure 4:
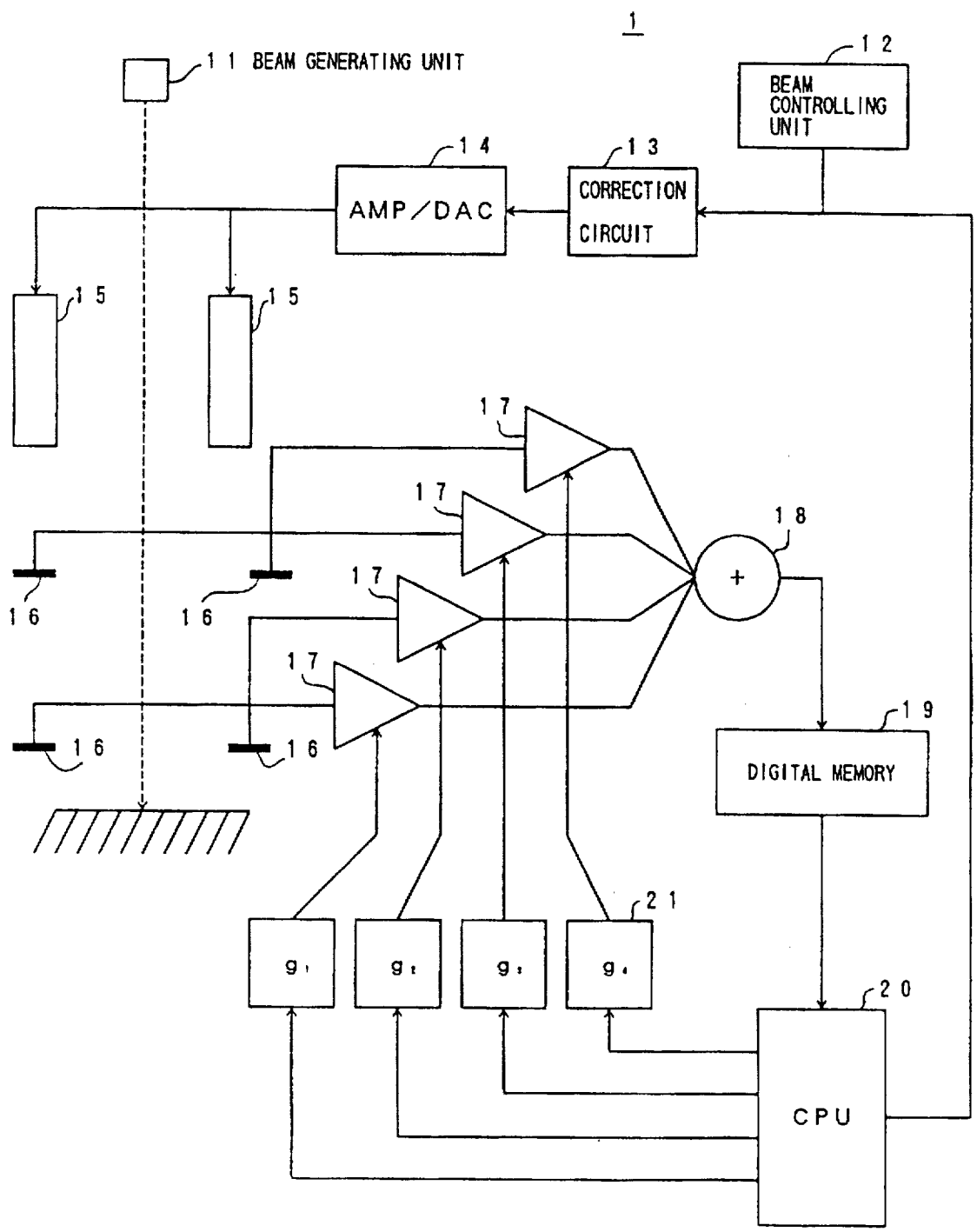
FIG. 4 is a circuit diagram according to a first embodiment of a first principle of the present invention.

FIG. 4 is a circuit diagram according to the first embodiment of the first principle of the present invention. In the figure, an electron-beam exposure device 1 includes a beam generating unit 11, a beam controlling unit 12, a correction circuit 13, an AMP/DAC 14, and a deflector 15.

The beam generating unit 11 generates the electron beam. The beam controlling unit 12 sends to the correction circuit 13 deflection coordinate data for deflecting the electron beam. The correction circuit 13 applies distortion correction and deflection-rate correction to the deflection coordinate data to generate a deflection coordinate signal. The AMP/DAC 14 amplifies the deflection coordinate signal to generate an electric current to be applied to the deflector 15. The deflector 15 to which the electric current is applied deflects the electron beam such that it illuminates a position indicated by the beam controlling unit 12.

The electron-beam exposure device 1 further includes scattered-electron detectors 16, amplifiers 17, an adder 18, a memory 19, a CPU 20, and registers 21. The scattered-electron detectors 16 which detect scattered electrons are arranged symmetrically around a center point of an electron-beam axis. Detected signals from the scattered-electron detectors 16 are applied to the amplifiers 17.

The CPU 20 receives the deflected coordinate data from the beam controlling unit 12, and calculates amplification factors $g_1$, $g_2$, $g_3$, and $g_4$ for the amplifiers 17 by using the equation (2), (3), (6), or (7) with the deflected coordinate data. The CPU 20 stores the calculated amplification factors $g_1$, $g_2$, $g_3$, and $g_4$ in the registers 21. The amplifiers 17 amplify the detected signals from the scattered-electron detectors 16 according to the amplification factors $g_1$, $g_2$, $g_3$, and $g_4$ stored in the registers 21.

When the equation (6) or (7) is used, it is necessary to measure $V_i(X)$ in advance by using a flat wafer which has no mark on a surface thereof. Since it is impossible to measure $V_i(X)$ at all necessary points, an interpolation function which will be described later may be used.

The adder 18 adds the amplified signals to generate a symmetric added signal, which is stored in the memory 19. Data of the symmetric added signal stored in the memory 19 is analyzed by the CPU 20 in order to detect the mark position.

In the first embodiment, the registers 21 store the amplification factors of the amplifiers 17, which are calculated by the CPU 20 to make the outputs of the amplifiers 17 constant. Since these amplification factors stored in the registers 21 are used for amplifying the detected signals from the scattered-electron detectors 16, there is no asymmetry in the added signal. Thus, errors caused by a signal asymmetry are non-existent when the CPU 20 detects the mark position.

In the following, a second embodiment of the first principle of the present invention will be described. In the second embodiment, the calculation of the amplification factors shown in the equation (2), the equation (3), the equation (6), or the equation (7) can be used.

Figure 5:
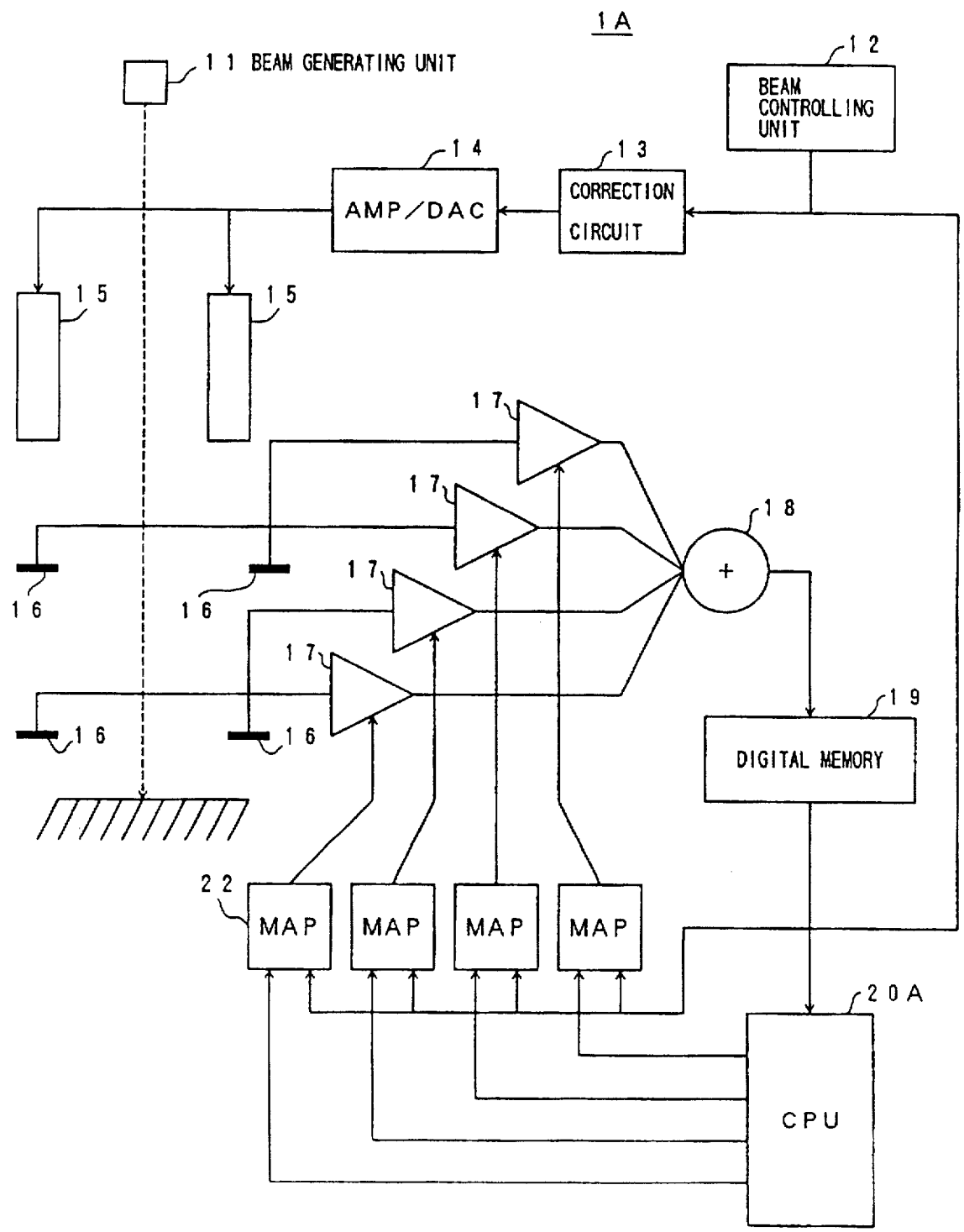
FIG. 5 is a circuit diagram according to a second embodiment of the first principle of the present invention.

FIG. 5 is a circuit diagram according to the second embodiment of the first principle of the present invention. The second embodiment of FIG. 5 differs from the first embodiment of FIG. 4 only in maps 22 and a CPU 20A. In FIG. 5, the same elements as those of FIG. 4 are referred to by the same numerals, and a description thereof will be omitted.

In the same manner as in the first embodiment, the scattered-electron detectors 16 are arranged symmetrically around the center of the electron beam axis to detect the scattered electrons. The detected signals of the scattered-electron detectors 16 are provided to the amplifiers 17.

The CPU 20A calculates in advance the amplification factors of the amplifiers 17 for every point of the deflection coordinates, and stores them in the maps 22 comprising memory. The maps 22 receive the deflection coordinate data from the beam controlling unit 12, and output the amplification factors $g_1$, $g_2$, $g_3$, and $g_4$ which are stored in addresses corresponding to the deflection coordinate data. The detected signals of the scattered-electron detectors 16 are amplified by the amplifiers 17 according to the amplification factors $g_1$, $g_2$, $g_3$, and $g_4$.

When the equation (6) or (7) is used, it is necessary to measure $V_i(X)$ in advance by using a flat wafer which has no mark on a surface thereof. Since it is impossible to measure $V_i(X)$ at all necessary points, an interpolation function which will be described later may be used.

Instead of preparing the addresses of the maps 22 for all the possible deflection coordinate data, addresses may be prepared only for representative points of the deflection coordinates to store fewer amplification factors. When there is no address corresponding to the deflection coordinate data input to the maps 22, amplification factors of a nearby address are read out for a linear interpolation to provide an amplification factor corresponding to the input deflection coordinate data.

The adder 18 adds the amplified signals to generate a symmetric added signal, which is stored in the memory 19. Data of the symmetric added signal stored in the memory 19 is analyzed by the CPU 20A in order to detect the mark position.

In the second embodiment, the maps 22 store the amplification factors of the amplifiers 17, which are calculated by the CPU 20A to make the outputs of the amplifiers 17 constant. The maps 22 provide the amplifiers 17 with the amplification factors stored in addresses corresponding to the deflection coordinate data. Therefore, the output magnitudes of the amplifiers 17 become constant so that there is no asymmetry in the added signal after the amplification. Thus, errors caused by a signal asymmetry are non-existent when the CPU 20 detects the mark position.

In the following, a third embodiment of the first principle of the present invention will be described. The third embodiment is concerned with the calculation of the amplification factors shown in the equation (6) or (7).

Figure 6:
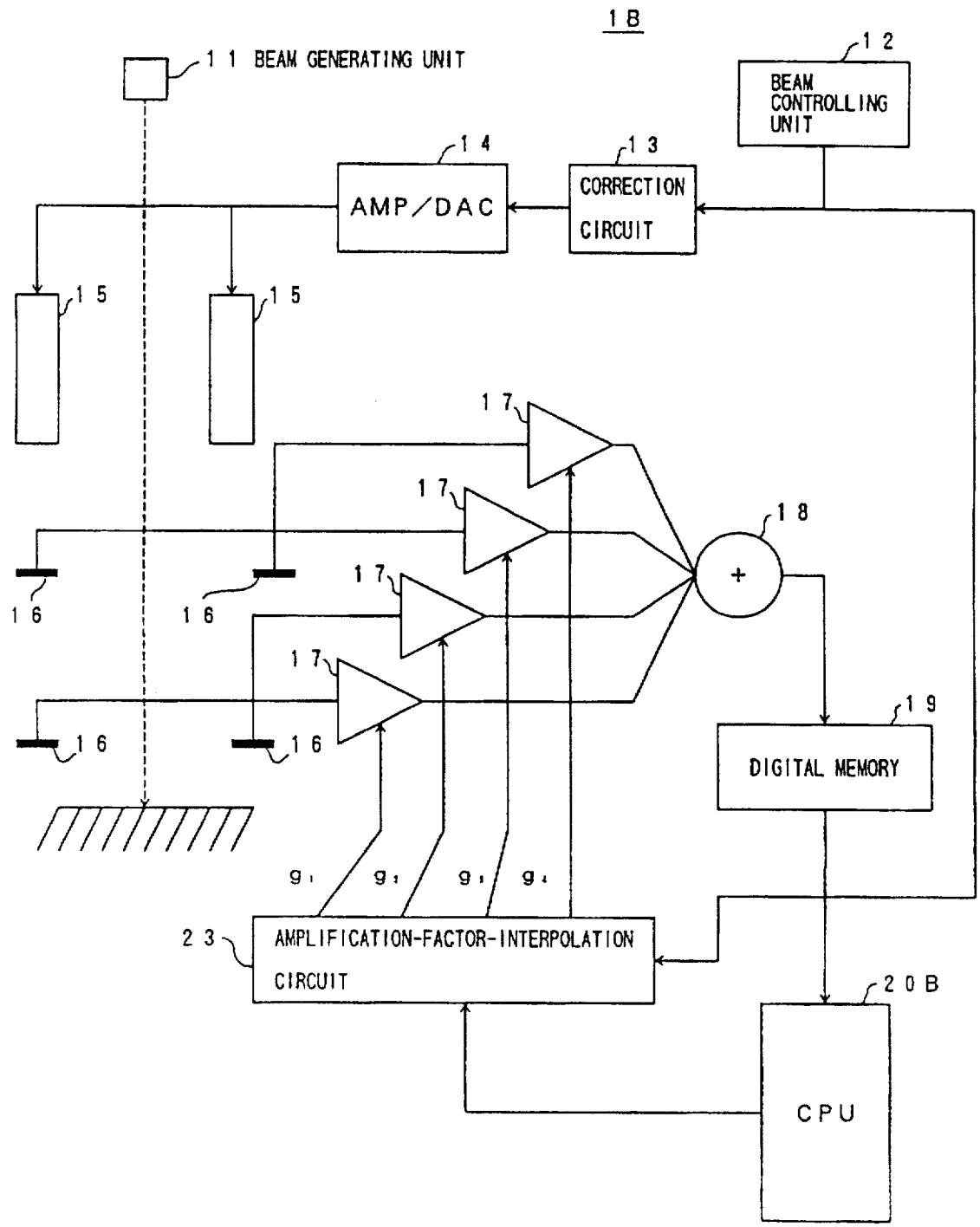
FIG. 6 is a circuit diagram according to a third embodiment of the first principle of the present invention.

FIG. 6 is a circuit diagram according to the third embodiment of the first principle of the present invention. The third embodiment of FIG. 6 differs from the first embodiment of FIG. 4 only in an amplification-factor-interpolation circuit 23 and a CPU 20B. In FIG. 6, the same elements as those of FIG. 4 are referred to by the same numerals, and a description thereof will be omitted.

First, a signal output $V_i(X_j)$ of the i-th scattered-electron detector 16 is measured by illuminating the electron beam having a constant electron amount and a constant beam size on a flat surface of a wafer at a point $X_j$ (j=1, 2, ..., n). Here, the flat surface of the wafer is homogeneous and has no structure such as marks. Also, the reference amplification factors of the amplifiers are assumed to be equal for simplicity. The amplification factor $g_i(X)$ of the equation (7) is represented by an interpolation function:

$$F_i(x, y) = \sum_{k,l} A_{ikl} \cdot x^k \cdot y^l \quad (k+l < m) \tag{8}$$

Namely, interpolation coefficients $A_{ikl}$ are obtained such that the equation (8) becomes equal to the amplification factor $g_i(X_j)$ which is obtained from the signal output $V_i(X_j)$ measured at the point $X_j$. In this manner, the interpolation coefficients $A_{ikl}$ of the i-th scattered-electron detector 16 are obtained for all the scattered-electron detectors 16 (for all i). The CPU 20B sets the interpolation coefficients $A_{ikl}$ in the amplification-factor-interpolation circuit 23 for all the scattered-electron detectors 16.

In the same manner as in the first and second embodiments, the scattered-electron detectors 16 are arranged symmetrically around the center of the electron beam axis to detect the scattered electrons. The detected signals of the scattered-electron detectors 16 are provided to the amplifiers 17.

The amplification-factor-interpolation circuit 23 receives the deflection coordinate data, and outputs the amplification factors $g_i(X)$ of the amplifiers 17 by calculating the equation (8) using the interpolation coefficients $A_{ikl}$ and the deflection coordinate data. The detected signals of the scattered-electron detectors 16 are amplified by the amplifiers 17 according to the amplification factors $g_i(X)$.

The adder 18 adds the amplified signals to generate a symmetric added signal, which is stored in the memory 19. Data of the symmetric added signal stored in the memory 19 is analyzed by the CPU 20A in order to detect the mark position.

In the third embodiment, the CPU 20B calculates the interpolation coefficients $A_{ikl}$ for the interpolation function of the amplification factors $g_i(X)$, and, then, stores them in the amplification-factor-interpolation circuit 23. The amplification-factor-interpolation circuit 23 calculates the amplification factors $g_i(X)$ according to the deflection coordinate data, and provides it to the amplifiers 17. Therefore, the output magnitudes of the amplifiers 17 become constant so that there is no asymmetry in the added signal after the amplification. Thus, errors caused by a signal asymmetry are non-existent when the CPU 20B detects the mark position.

Figure 7:
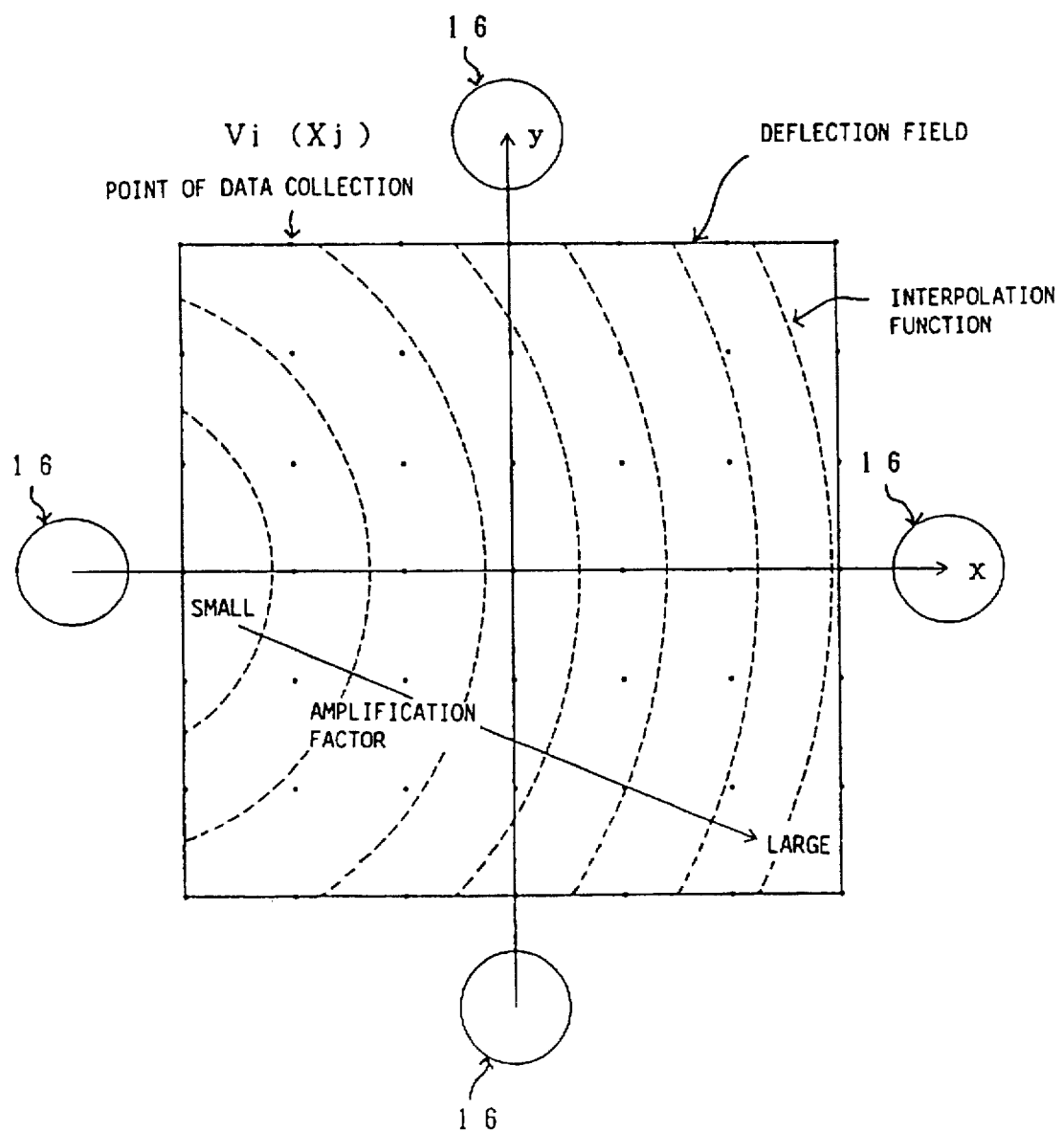
FIG. 7 is an illustrative drawing showing data-collection points for obtaining interpolation coefficients.

FIG. 7 is an illustrative drawing showing a data collection for obtaining the interpolation coefficients $A_{ikl}$. FIG. 7 shows a deflection field surrounded by the scattered-electron detectors 16, within which the electron beam can be deflected to any point. In this deflection field, a wafer having a flat and homogeneous surface is arranged, and an electron beam having a constant current amount (current density) and a constant shape is positioned on the flat surface of the wafer. Points illuminated by the electron beam, i.e., the points of deflection, are arranged as shown in FIG. 7. The electron beam illuminates each of these points successively, and electrons scattered by each point are detected by the scattered-electron detectors 16. Then, the outputs $V_i(X_j)$ of the scattered-electron detectors 16 are measured.

The output of a scattered-electron detector 16 becomes smaller as a distance between the scattered-electron detector 16 and the deflection point increases. Thus, the amplification factor $g_i(X)$ for keeping the output of the scattered-electron detector 16 constant must be larger for a larger distance. The amplification factor $g_i(X)$ having such a characteristic is represented by an interpolation function as shown in FIG. 7 by dotted-curve contours, where the interpolation function is shown for the scattered-electron detector 16 on the left-hand side. The interpolation coefficients of the interpolation function are determined such that values of the interpolation function at the points shown in FIG. 7 become equal to the $g_i(X_j)$ which is obtained from the $V_i(X_j)$ measured at these points.

In the manner described above, the interpolation functions representing the amplification factors $g_i(X)$ are obtained to make equal all the output levels of the scattered-electron detectors 16. As described above, the amplification factors obtained from the interpolation functions are used in the first through third embodiments. In the above description, the interpolation function has been represented as a two-dimensional polynomial of the coordinates x and y. However, it is apparent that an interpolation function of any form can be used.

In the first through third embodiments described above, the amplification factors are calculated based on the deflection coordinates. However, the first principle, according to which the amplification factors are set to keep the outputs of the amplifiers constant irrespective of a deflection position, can be implemented without such a calculation. In the following, such an embodiment will be described.

Figure 8:
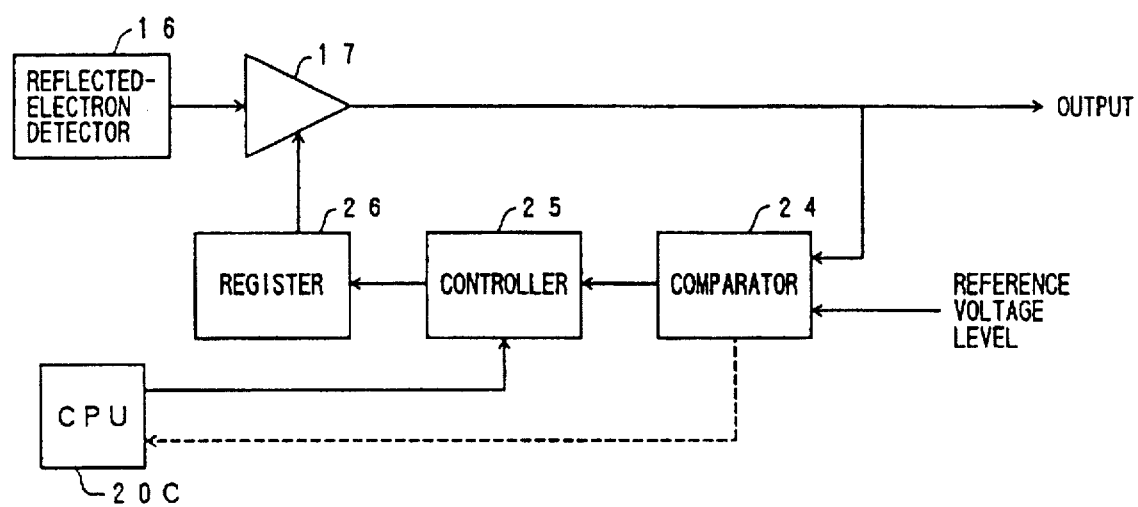
FIG. 8 is a block diagram according a fourth embodiment of the first principle of the present invention.

FIG. 8 is a block diagram according to a fourth embodiment of the first principle of the present invention. FIG. 8 shows a signal detecting part of an electron-beam exposure device in relation with a scattered-electron detector. The fourth embodiment of FIG. 8 includes the scattered-electron detector 16, the amplifier 17, a CPU 20C, a comparator 24, a controller 25, and a register 26.

In the fourth embodiment, an electron beam is positioned on a surface of a wafer in a proximity of a mark provided thereon. It is required that the electron beam illuminates a flat surface having a high electron reflectivity.

With the electron beam illuminating the flat surface, the CPU 20C turns the controller 25 on. The comparator 24 receives an output of the amplifier 17 and a predetermined reference voltage level to compare them with each other, and provides a comparison result to the controller 25. Based on the comparison result, the controller 25 increases an amplification factor stored in the register 26 when the reference voltage level is greater than the amplifier output, and decreases the amplification factor stored in the register 26 when the reference voltage level is smaller than the amplifier output.

The controller 25 continues to increase or decrease the amplification factor stored in the register 26 until the comparison result shows that the reference voltage level and the amplifier output are equal, or until a predetermined period of time passes. Then, the CPU 20C turns the controller 25 off.

The amplification-factor setting process described above is carried out for all the amplifiers 17. In this manner, the amplification factors are set such that the outputs of the amplifiers 17 are equal to the reference voltage level in the proximity of the mark on the wafer surface. Thus, the outputs of the amplifiers 17 are equal to each other, and there is no asymmetry in a signal obtained by adding the outputs of the amplifiers 17.

Figure 9:
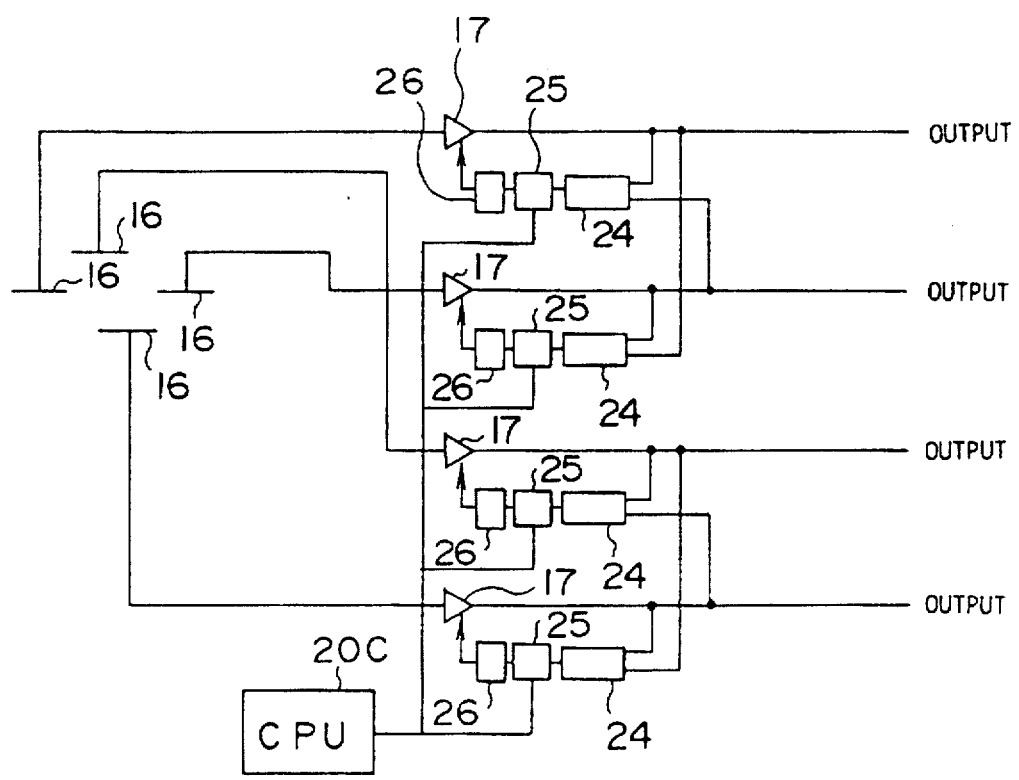
FIG. 9 is a block diagram according a fifth embodiment of the first principle of the present invention.

FIG. 9 is a block diagram according a fifth embodiment of the first principle of the present invention. FIG. 9 shows a signal detecting part of an electron-beam exposure device in relation with a scattered-electron detector. The fifth embodiment of FIG. 9 includes the scattered-electron detectors 16, the amplifiers 17, the CPU 20C, the comparators 24, the controllers 25, and the registers 26.

In the fifth embodiment, the reference voltage level of the scattered-electron detector 16 of the fourth embodiment is an output voltage level of an amplifier 17 of another scattered-electron detector 16. In an example of FIG. 9, the reference voltage level is provided from an amplifier 17 of a scattered-electron detector 16 which is arranged on the opposite side. A method of setting the amplification factors in the fifth embodiment is the same as that of the fourth embodiment, and a description thereof will be omitted.

In the fifth embodiment, the amplification factors are determined between the opposing scattered-electron detectors 16 by using each other as a reference. Thus, the outputs of the amplifiers 17 of the opposing scattered-electron detectors 16 are equal to each other, so that there is no asymmetry in the added signal.

Figure 10:
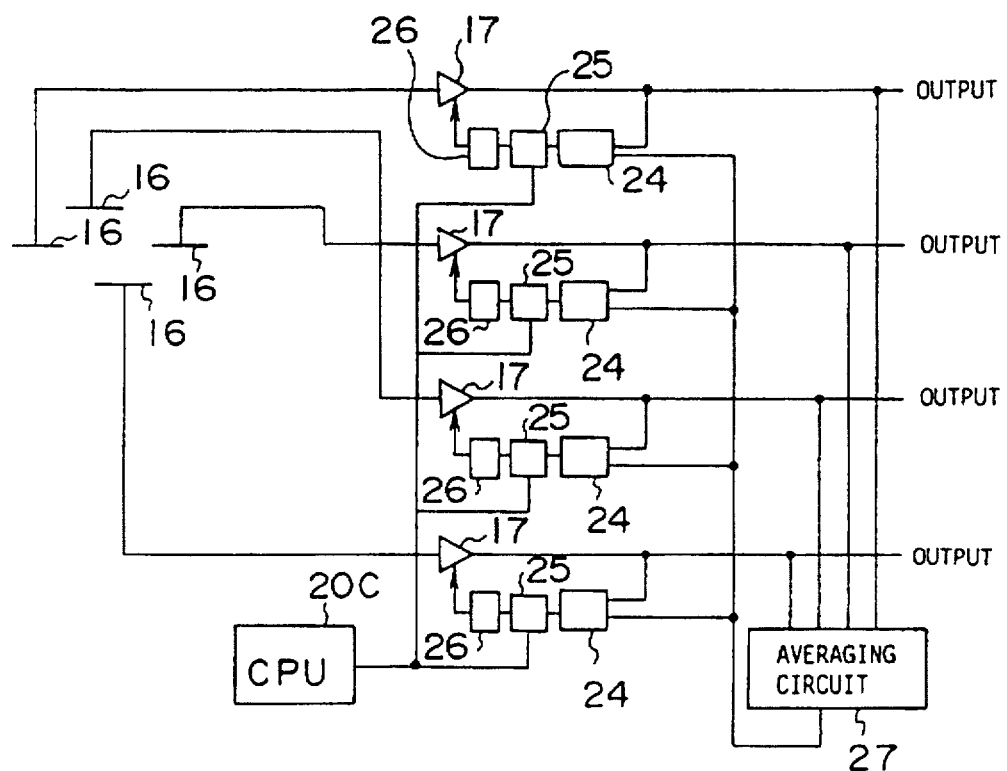
FIG. 10 is a block diagram according a sixth embodiment of the first principle of the present invention.

FIG. 10 is a block diagram according a sixth embodiment of the first principle of the present invention. FIG. 10 shows a signal detecting part of an electron-beam exposure device in relation with a scattered-electron detector. The sixth embodiment of FIG. 10 includes the scattered-electron detectors 16, the amplifiers 17, the CPU 20C, the comparators 24, the controllers 25, the registers 26, and an averaging circuit 27.

In the sixth embodiment, the reference voltage level of the scattered-electron detector 16 of the fourth embodiment is an average voltage level of the outputs of the amplifiers 17 of all the scattered-electron detectors 16. In an example of FIG. 10, the outputs of all the amplifiers 17 are input to the averaging circuit 27. The averaging circuit 27 generates an average of the signals input thereto, and provides it to the comparators 24. A method of setting the amplification factors in the sixth embodiment is the same as that of the fourth embodiment, and a description thereof will be omitted.

In the sixth embodiment, the amplification factors are determined by using the outputs of the amplifiers 17 of all the scattered-electron detectors 16 as the reference voltage level. Thus, the outputs of the amplifiers 17 of all the scattered-electron detectors 16 are equal to each other, so that there is no asymmetry in the added signal.

In the fourth through sixth embodiments of the first principle, there is no need to calculate the amplification factors based on the deflection coordinates. Thus, a system which determines the amplification factors in the electron-beam exposure device is simplified.

According to the first principle of the present invention, connection errors on boundaries between deflection fields are greatly reduced compared to the prior-art method. It is shown in an evaluation experiment that connection errors between deflection fields in the prior art are as much as 0.05 μm. With an asymmetry eliminated in the present invention, connection errors between deflection fields are reduced to about 0.02 μm.

In the following, a second principle of the present invention will be described.

The first embodiment eliminates the asymmetry in the added signal. On the other hand, the second embodiment is concerned with the use of features which are found in a signal from each scattered-electron detector and are free from position-detection errors. Such features can be found in a signal before addition, and, also, in a signal after the addition.

In order to detect a mark-edge position in an added signal, a peak of the differential of the added signal is conventionally used as the edge position. However, since a signal magnitude is larger for a detector nearer to the mark and weaker for a detector farther from the mark, the added signal has an asymmetry. Thus, a mark position detected from this added signal contains an error as previously described.

In the second principle of the present invention, use of features free from the position-detection errors enables an error-free position detection without a need to add the signals from the detectors. Such features free from the position-detection errors with regard to a given mark edge include an edge signal from a detector which does not detect electrons scattered by a side wall of this mark edge.

In general, a peak of a signal formed by electrons scattered by the side wall of a mark edge depends on a material and a shape of the mark and on the solid angle of a detector. Thus, the measurement of a mark-edge position based on the electrons scattered by the mark-edge side wall contains errors attributable to various factors such as the shape and material of the mark.

On the other hand, an edge signal from a detector not in a position to view the mark-edge side wall is created when the electron beam falls into the bottom just beside the side wall, and, thus, no electron reaches the detector. Thus, a form of this edge signal depends solely on the position of the mark edge.

When signal forms from a plurality of detectors contain the same features free from the position-detection errors, these signal forms may be added before an extraction of these features for detecting a position. Doing so can generally reduce an effect of signal noise on the position detection.

According to the second principle, the signal form from the detector not in a position of viewing a mark-edge side wall or a sum of the signal forms from the detectors not in a position of viewing the mark-edge side wall are analyzed to detect the mark-edge position. Thus, it is possible to detect the mark position without errors attributable to a material and a three-dimensional shape of the mark.

As described in the above, the signal form obtained from electrons scattered by the mark-edge side wall contains a positional displacement. Thus, even when the first embodiment is applied to keep the outputs of the detectors constant, it is possible that errors of the position detection remain because of this positional displacement. Even in such a case, a mark-position detection free from errors can be achievable by using the second principle.

Figure 11A:
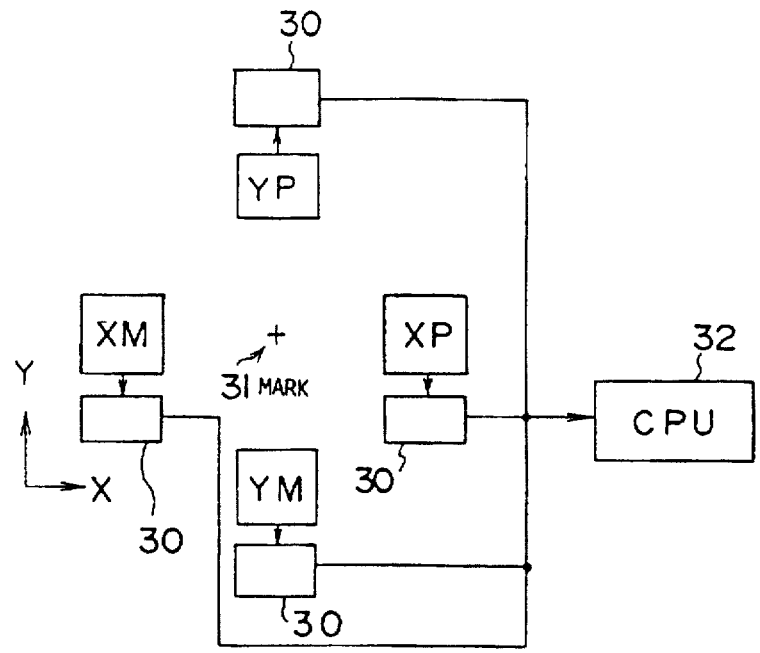
FIG. 11A is a block diagram of a seventh embodiment according to a second principle of the present invention.
Figure 11B:
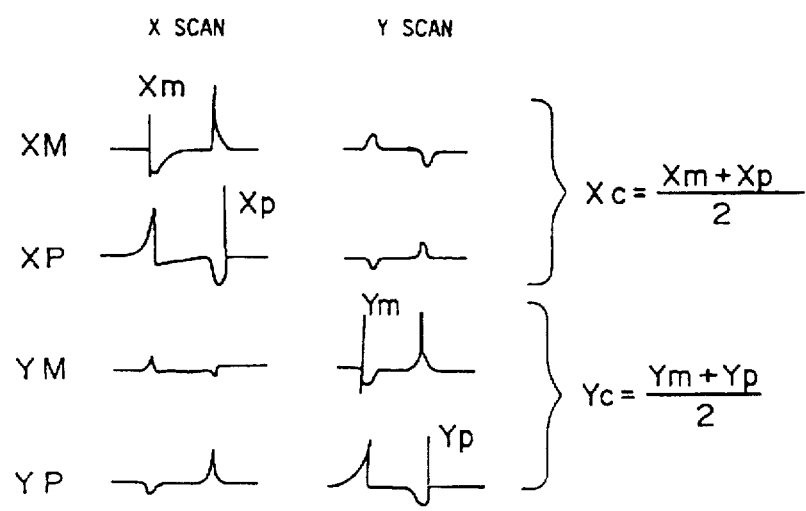
FIG. 11B is an illustrative drawing showing an analysis of scattered-electron signals according to the seventh embodiment.

In the following, a seventh embodiment according to the second principle of the present invention will be described. FIG. 11A is a block diagram of the seventh embodiment according to the second principle of the present invention. FIG. 11B is an illustrative drawing showing an analysis of scattered-electron signal forms according to the seventh embodiment.

In FIG. 11A, scattered-electron detectors XM, XP, YM, and YP each provided with a signal-form memory 30 are arranged in an X direction and in a Y direction around a cross-edge mark 31 engraved in a surface, i.e., the cross-edge mark 31 comprising grooves formed in a surface. The signal-form memory 30 is connected to a CPU 32, which carries out the signal-form analysis.

With the scattered-electron detectors XM, XP, YM, and YP being arranged as shown in FIG. 11A, an electron beam is scanned over the cross-edge mark 31. Reflection-signal forms as shown in FIG. 11B are obtained from the scattered-electron detectors XM, XP, YM, and YP with respect to an X-direction scan and a Y-direction scan.

As shown in FIG. 11B, a position Xm of an edge on a minus side in the X direction is obtained by analyzing a reflection-signal form from the detector XM. A position Xp of an edge on a plus side in the X direction is obtained by analyzing a reflection-signal form from the detector XP. A position Ym of an edge on a minus side in the Y direction is obtained by analyzing a reflection-signal form from the detector YM. Finally, a position Yp of an edge on a plus side in the Y direction is obtained by analyzing a reflection-signal form from the detector YP. Then, a center position of the mark (Xc, Yc) is obtained as:

$$Xc=(Xm+Xp)/2 \qquad (9)$$

$$Yc=(Ym+Yp)/2 \qquad (10)$$

In order to implement this detection method, it is not always necessary to provide the signal-form memories 30 in the same number as the scattered-electron detectors. For example, if a mechanism is provided to turn on and off the signals from the scattered-electron detectors according to the beam scanning position, only one signal-form memory 30 is sufficient.

In the seventh embodiment of the second principle, a mark-edge position is detected by analyzing a signal form obtained from a detector which is not in a position of viewing the mark-edge side wall. Thus, it is possible to detect the mark position without errors attributable to a material and a three-dimensional shape of the mark.

Figure 12:
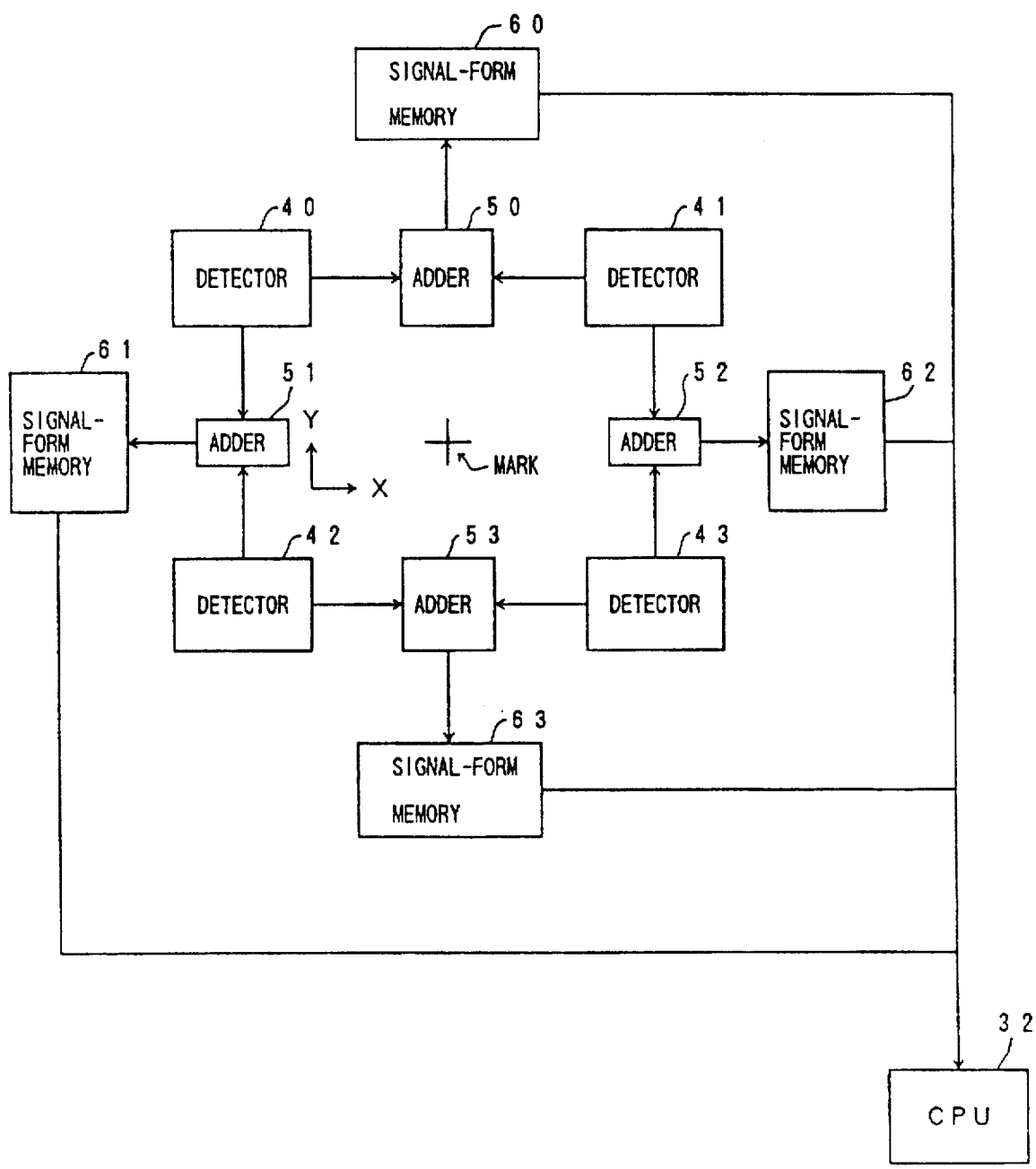
FIG. 12 is a block diagram according to an eighth embodiment of the second principle of the present invention.

FIG. 12 is a block diagram according to an eighth embodiment of the second principle of the present invention, and, at the same time, shows a configuration of the scattered-electron detectors.

As shown in FIG. 12, scattered-electron detectors 40, 41, 42, and 43 arranged around the cross-edge mark 31 are connected to adders 50, 51, 52, and 53. The adders 50, 51, 52, and 53 are in turn connected to the signal-form memories 60, 61, 62, and 63, respectively. The signal-form memories 60, 61, 62, and 63 are connected to the CPU 32, which performs a signal-form analysis.

With the scattered-electron detectors 40, 41, 42, and 43 being arranged as shown in FIG. 12, an electron beam is scanned over the cross-edge mark 31. When an edge on the minus side in the X direction is scanned in the detection of the cross-edge mark 31, a sum of signals from the detectors 40 and 42 is stored in the signal-form memory 61. When an edge on the plus side in the X direction is scanned, a sum of signals from the detectors 41 and 43 is stored in the signal-form memory 62. When an edge on the minus side in the Y direction is scanned, a sum of signals from the detectors 42 and 43 is stored in the signal-form memory 63. When an edge on the plus side in the Y direction is scanned, a sum of signals from the detectors 40 and 41 is stored in the signal-form memory 60.

A position Yp of the edge on the plus side in the Y direction is obtained from the signal form stored in the signal-form memory 60. A position Xm of the edge on the minus side in the X direction is obtained from the signal form stored in the signal-form memory 61. A position Xp of the edge on the plus side in the X direction is obtained from the signal form stored in the signal-form memory 62. A position Ym of the edge on the minus side in the Y direction is obtained from the signal form stored in the signal-form memory 63.

In the eighth embodiment of the second principle, a mark-edge position is detected by analyzing signal forms obtained from detectors which are not in a position of viewing the mark-edge side wall. Thus, it is possible to detect the mark position without errors attributable to a material and a three-dimensional shape of the mark.

In the following, a third principle of the present invention will be described. The third principle is concerned with a method and a device for mounting a mark, where errors are reduced in the detection of a mark position.

In order to clarify the significance of the third embodiment, a method and a device for mounting a mark of the related art will be described first. In general, a mark used for detecting a beam position needs to be provided on a surface of the same height as that of a wafer used in a real exposure process, to be readily exchangeable, and to be mounted at the same height and the same position after the exchange.

Figures 13A, 13B, 13C:
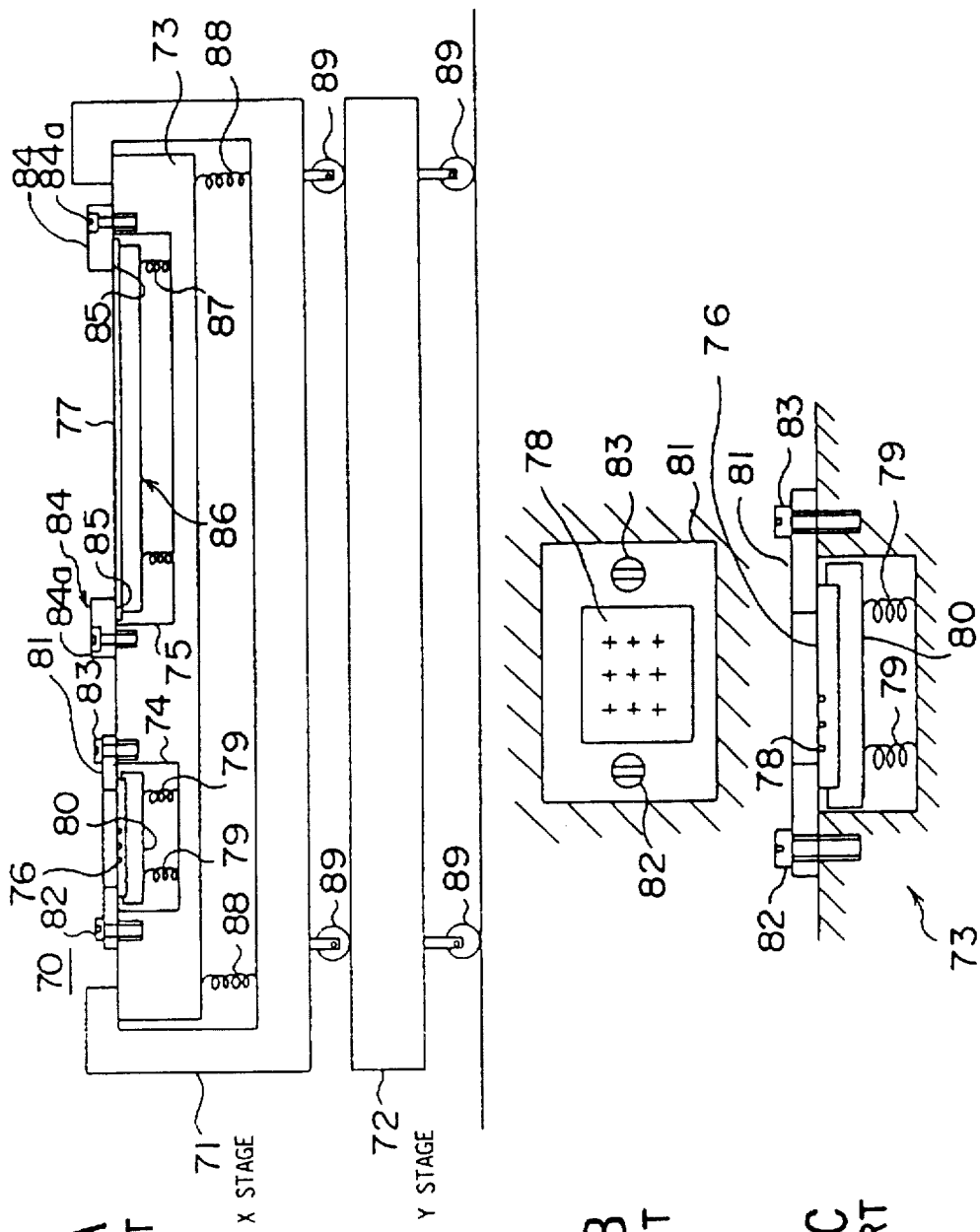
FIG. 13A is a cross-sectional view of an X-Y stage for mounting wafers.
FIG. 13B is a partially expanded plan view of the X-Y stage of FIG. 13A.
FIG. 13C is a partially expanded cross-sectional view of the X-Y stage of FIG. 13A.

In order to satisfy these conditions, a mark is provided on a stage having a structure as shown in FIGS. 13A through 13C. FIG. 13A is a cross-sectional view of an X-Y stage 70 for mounting wafers. FIG. 13B is a partially expanded plan view of the X-Y stage 70. FIG. 13C is a partially expanded cross-sectional view of the X-Y stage 70.

As shown in FIG. 13A, the X-Y stage 70 includes an X stage 71, a Y stage 72, and a wafer holder 73 provided inside the X stage 71. The X stage 71 and the Y stage 72 are movable in an X direction and a Y direction through wheels 89. The wafer holder 73 is stored in the X stage 71, and is urged upward by springs 88 to be fixed.

The wafer holder 73 includes recesses 74 and 75, which store a reference chip 76 and a wafer 77, respectively. As shown in FIGS. 13B and 13C, the reference chip 76 having marks 78 thereon is mounted on a chip stage 80, which is urged upward against a window frame 81 by springs 79. Thus, the reference chip 76 is fixed on the chip stage 80. The window frame 81 is fixedly mounted on an upper surface of the wafer holder 73 through screws 82 and 83.

As shown in FIG. 13A, the wafer 77 is placed on a wafer stage 86, which is urged upward against a stopping face 85 of stoppers 84 by springs 87. Each of the stoppers 84 is attached on the upper surface of the wafer holder 73 through a screw 84a. Therefore, if the upper surface of the wafer holder 73 is formed with precision, an upper surface of the wafer 77 to be subjected to a real exposure process is guaranteed of being at the same height as an upper surface of the reference chip 76.

However, a configuration shown in FIGS. 13A through 13C has a problem in that some of the marks 78 are obscured by the window frame 81 from a detector.

Figure 14:
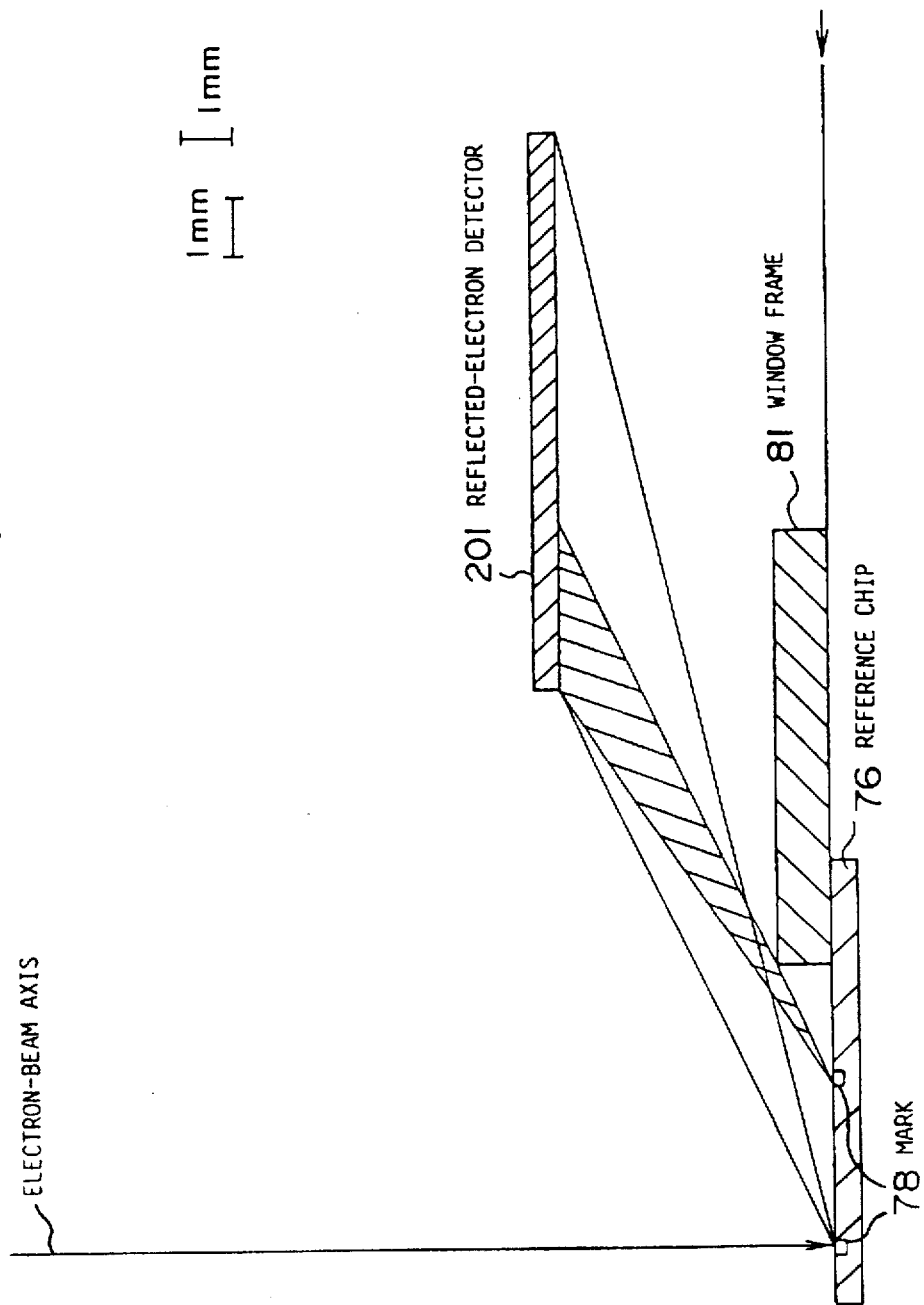
FIG. 14 is an illustrative drawing showing a relation between a reference chip and a scattered-electron detector.

FIG. 14 is an illustrative drawing showing a relation between the reference chip 76 and a scattered-electron detector 201. In general, a size of the scattered-electron detector 201 is 10 mm by 10 mm, and a distance between the scattered-electron detector 201 and the optical axis of an electron beam is 10 mm. The window frame 81 for the reference chip 76 needs to be at least 1-mm thick in order to guarantee enough sturdiness and flatness thereof. A size of the reference chip 76 is 10 mm by 10 mm.

In a configuration shown in the figure, there is no problem in detecting the marks 78 located near the center of the reference chip 76. However, electrons scattered by the marks 78 which are located near a perimeter of the reference chip 76 are partially obstructed by the window frame 81, and do not fully reach the scattered-electron detector 201. As a result, errors are generated in the detection of mark positions.

It was shown in an experiment that an error in the position detection can be 0.02 μm at maximum for the marks 78 located near the window frame 81. When this error is assumed to be generated at an end of a deflection field, a connection error twice as much as this error of 0.02 μm, i.e., an error of 0.04 μm, should be observed between deflection fields. Also, when the wafer 77 is aligned, scattered electrons are partially obstructed by the stoppers 84 for stopping the wafer 77. This can also be a cause of the position-detection errors.

In order to obviate the above problems, according to the third principle of the present invention, the reference chip and the chip holder are attached with glue to be integrated, and an upper surface of the reference chip is finished to achieve a high precision relative to the chip holder. Then, the chip holder, not the upper surface of the reference chip, is vertically aligned with the wafer holder.

In the third principle of the present invention, the chip holder is vertically aligned with the wafer holder, so that there is no need to urge the reference chip against the window frame. Thus, electrons scattered by the marks are not obstructed by the window frame, so that no error is generated in the position detection.

Figure 15:
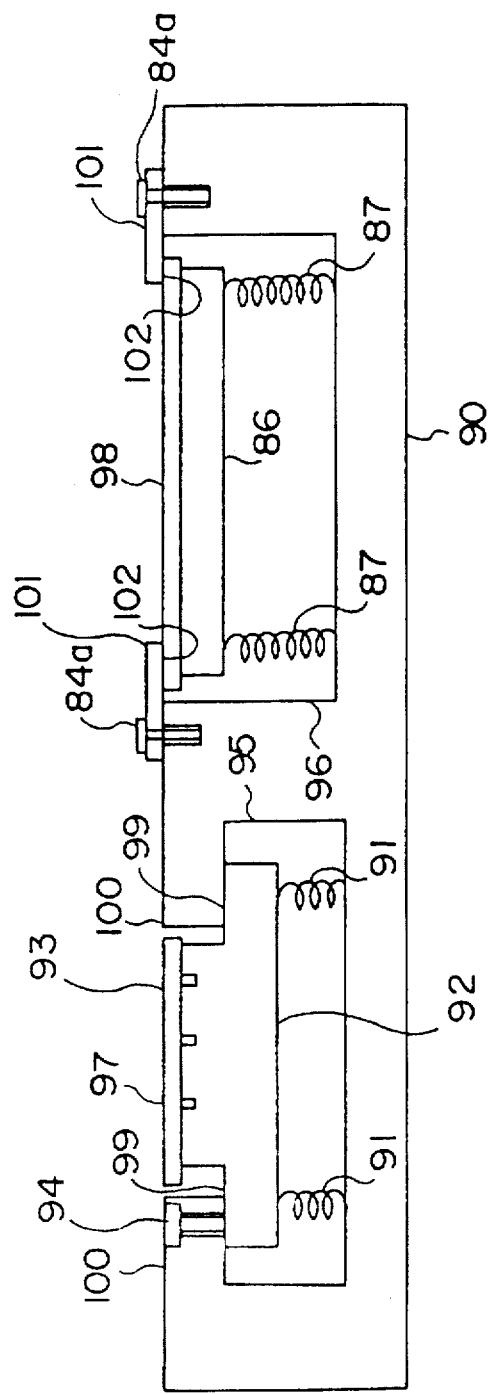
FIG. 15 is a cross-sectional view of a wafer holder according to a ninth embodiment of a third principle of the present invention.

FIG. 15 is a cross-sectional view of a wafer holder 90 according to a ninth embodiment of the third principle. In the figure, the ninth embodiment includes the wafer holder 90, springs 91, a chip holder 92, a reference chip 93, and a screw 94.

The wafer holder 90 includes recesses 95 and 96, which store the chip holder 92 and a wafer 98, respectively. As shown in FIG. 15, the reference chip 93 is integrated with the chip holder 92 through glue and the like. The chip holder 92 is urged upward by springs 91, so that step-shape parts 99 of the chip holder 92 are pushed against protruding parts 100 of the recess 95. In this manner, the chip holder 92 is fixed in the recess 95. The wafer 98 is urged against a stopping face 102 of stoppers 101, which are fixed on an upper surface of the wafer holder 90.

It is difficult to form the reference chip 93 with such a precise thickness that an accuracy of height required in the electron-beam exposure device is achieved. On the other hand, with the reference chip 93 being integrated with the chip holder 92 as shown in FIG. 15, it is not difficult to achieve a required precision in a distance from the step-shape parts 99 of the chip holder 92 to an upper surface 97 of the reference chip 93.

Thus, in the configuration of FIG. 15 according to the ninth embodiment, the upper surface 97 of the reference chip 93 is fixed at the same height as the upper surface of the wafer holder 90. Here, in order to finely adjust the height of the upper surface 97 of the reference chip 93, a screw 94 is provided through one of the protruding parts 100.

Figure 16:
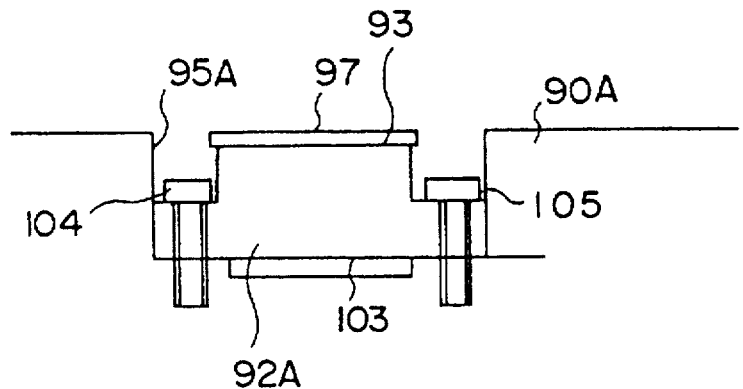
FIG. 16 is a partial cross-sectional view of a wafer holder according to a tenth embodiment of the third principle of the present invention.

FIG. 16 is a partial cross-sectional view of a wafer holder 90A according to a tenth embodiment of the third principle of the present invention. In the tenth embodiment of FIG. 16, the wafer holder 90A includes a recess 95A for storing a chip holder 92A. Here, a distance from a bottom surface 103 of the chip holder 92A to the upper surface 97 of the reference chip 93 is formed within a required accuracy. The chip holder 92A is fixedly mounted in the recess 95A through screws 104 and 105.

Accordingly, in a configuration of FIG. 16 according to the tenth embodiment, the upper surface 97 of the reference chip 93 is fixed at the same height as the upper surface of the wafer holder 90A.

Figure 17:
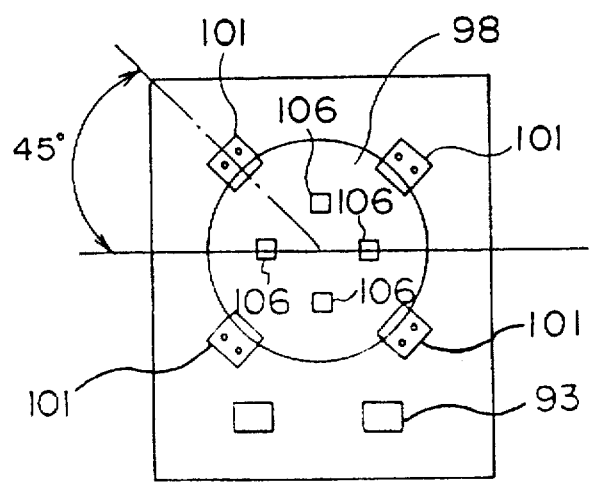
FIG. 17 is an illustrative drawing showing an arrangement of stoppers of FIG. 15 according to an eleventh embodiment of the third principle of the present invention.

FIG. 17 is an illustrative drawing showing an arrangement of the stoppers 101 of FIG. 15 according to an eleventh embodiment. In the eleventh embodiment, the stoppers 101 for stopping the wafer 98 are arranged at a 45° angle with directions in which scattered-electron detectors 106 are arranged.

In the eleventh embodiment, areas on the wafer in which scattered electrons are obstructed by the stoppers 101 are minimized. Thus, there is no position-detection error at the time of a global alignment or at the time of measurement of mirror correction data. Also, if the scattered-electron detectors 106 are arranged in the same directions as the scanning directions of the electron beam detecting the marks, errors are minimized in the detection of the mark-edge positions.

Further, the present invention is not limited to these embodiments, but various variations and modifications may be made without departing from the scope of the present invention.

What is claimed is:

1. An electron-beam exposure device having at least one deflector for deflecting an electron beam, and detecting a position of a position-detection mark with said electron beam, said electron-beam exposure device comprising:

a plurality of detectors detecting electrons scattered from said position-detection mark;

a plurality of amplifiers, each of said amplifiers amplifying an output of a corresponding one of said detectors; and setting means for setting amplification factors of said amplifiers such that a magnitude of an output from each of said amplifiers is constant irrespective of a deflected position of said electron beam at a time of detection of said position of said position-detection mark.

2. The electron-beam exposure device as claimed in claim 1, wherein said detectors comprise at least four detectors arranged symmetrically around an axis of said electron beam.

3. The electron-beam exposure device as claimed in claim 2, wherein said at least four detectors comprise pairs of detectors, each one of said pairs having a first detector and a second detector arranged symmetrically with respect to said axis, said output from said first detector and said output from said second detector being added.

4. The electron-beam exposure device as claimed in claim 1, wherein said setting means comprises:

a plurality of registers, each of which is connected to a corresponding one of said amplifiers and stores one of said amplification factors of said corresponding one of said amplifiers; and a controlling unit setting said amplification factors in said registers.

5. The electron-beam exposure device as claimed in claim 4, wherein said position-detection mark comprises a first groove extending in an X direction and a second groove extending in a Y direction, and said detectors comprises:

a first detector arranged in a +X and +Y direction with respect to said position-detection mark;

a second detector arranged in a +X and −Y direction with respect to said position-detection mark;

a third detector arranged in a −X and +Y direction with respect to said position-detection mark; and a fourth detector arranged in a −X and −Y direction with respect to said position-detection mark, and wherein said position-detection means comprises:

first adding means for adding outputs of said first detector and said second detector;

second adding means for adding outputs of said third detector and said fourth detector;

third adding means for adding outputs of said first detector and said third detector;

fourth adding means for adding outputs of said second detector and said fourth detector;

means for detecting positions of edges of said second groove by analyzing outputs of said first adding means and said second adding means when said electron beam is scanned in said X direction; and means for detecting positions of edges of said first groove by analyzing outputs of said third adding means and said fourth adding means when said electron beam is scanned in said Y direction.

6. The electron-beam exposure device as claimed in claim 1, wherein said setting means comprises:

map memories storing said amplification factors and receiving said deflected position as an address thereof, said map memories outputting said amplification factors stored at said address to said amplifiers; and a controlling unit storing said amplification factors corresponding to said deflected position in said map memories in advance.

7. The electron-beam exposure device as claimed in claim 6, further comprising means for obtaining said amplification factors through a linear interpolation when said deflected position corresponds to a point between two successive addresses of said map memories.

8. The electron-beam exposure device as claimed in claim 1, wherein said setting means comprises:

an interpolation circuit receiving said deflected position as a point (x, y) and outputting said amplification factors as $\Sigma A_{ij} x^i y^j$ to said amplifiers; and a controlling unit setting coefficients $A_{ij}$ in said interpolation circuit in advance.

9. The electron-beam exposure device as claimed in claim 1, wherein each of said amplification factors is proportional to $r^2$ said r being a distance between said deflected position and a corresponding one of said detectors.

10. The electron-beam exposure device as claimed in claim 9, wherein each of said amplification factors is $\alpha r^2/r_0^2$, said $\alpha$ being a reference amplification factor of a corresponding one of said amplifiers when said electron beam is positioned at an axis of said electron beam, said $r_0$ being a distance between said axis and said corresponding one of said detectors.

11. The electron-beam exposure device as claimed in claim 1, wherein each of said amplification factors is proportional to $1/\Omega$, said $\Omega$ being a solid angle of a corresponding one of said detectors when said corresponding one of said detectors is viewed from said deflected position.

12. The electron-beam exposure device as claimed in claim 11, wherein each of said amplification factors is $\alpha\Omega_0/\Omega$, said $\alpha$ being a reference amplification factor of a corresponding one of said amplifiers when said electron beam is positioned at an axis of said electron beam, said $\Omega_0$ being a solid angle of said corresponding one of said detectors when said corresponding one of said detectors is viewed from a position of said axis.

13. The electron-beam exposure device as claimed in claim 1, wherein each of said amplification factors is proportional to $1/V(X)$, said $V(X)$ being obtained for an arbitrary position X by interpolating a detector output $V(X_j)$ of a corresponding one of said detectors, said $V(X_j)$ being measured by positioning said electron beam on a flat surface of a wafer at a plurality of points $X_j$ (j=1, 2, ..., n).

14. The electron-beam exposure device as claimed in claim 13, wherein each of said amplification factors is $V_0/V(X)$, said $V_0$ being a detector output of said corresponding one of said detectors when said electron beam is positioned at an axis of said electron beam.

15. A method of detecting a position of a position-detection mark in an electron-beam exposure device which has at least one deflector for deflecting an electron beam and a plurality of detectors for detecting scattered electrons from said position-detection mark when said electron beam is positioned on said position detection mark, said method comprising the steps of:

a) detecting said scattered electrons by using said detectors;

b) amplifying an output of each of said detectors by a corresponding amplification factor so as to obtain said output having a constant magnitude independent of a deflected position of said electron beam;

c) adding for all of said detectors said output having a constant magnitude to obtain an added signal; and d) analyzing a form of said added signal to detect said position of said position-detection mark.

16. The method as claimed in claim 15, wherein said step b) comprises the steps of:

b1) calculating a value proportional to $r^2$, said r being a distance between one of said detectors and said deflected position; and b2) amplifying an output of said one of said detectors by a factor of said value proportional to $r^2$.

17. The method as claimed in claim 16, wherein said value proportional to $r^2$ is $\alpha r^2/r_0^2$, said $\alpha$ being a reference amplification factor for said one of said detectors when said electron beam is positioned at an axis of said electron beam, said $r_0$ being a distance between said axis and said one of said detectors.

18. The method as claimed in claim 15, wherein said step b) comprises the steps of:

b1) calculating a solid angle $\Omega$ of one of said detectors viewed from said deflected position; and b2) amplifying an output of said one of said detectors by a factor proportional to $1/\Omega$.

19. The method as claimed in claim 18, wherein said factor proportional to $1/\Omega$ is $\alpha\Omega_0/\Omega$, said $\alpha$ being a reference amplification factor for said one of said detectors when said electron beam is positioned at an axis of said electron beam, said $\Omega_0$ being a solid angle of said corresponding one of said detectors when said corresponding one of said detectors is viewed from a position of said axis.

20. The method as claimed in claim 15, further comprising the steps of:

e) positioning said electron beam having a constant beam size and a constant current density on a flat surface of a wafer at a plurality of points $X_j$ (j=1, 2, ..., n); and e) detecting an output $V(X_j)$ of one of said detectors, wherein said step b) comprises the steps of:

b1) obtaining an output $V(X)$ for said deflected position by interpolating said output $V(X_j)$; and b2) amplifying an output of said one of said detectors by a factor proportional to $1/V(X)$.

21. The method as claimed in claim 20, wherein said factor proportional to $1/V(X)$ is $V_0/V(X)$, $V_0$ being an output of said one of said detectors when said electron beam is positioned at an axis of said electron beam.

22. An electron-beam exposure device having at least one deflector for deflecting an electron beam, and detecting a position of a position-detection mark with said electron beam, said position-detection mark including at least one groove formed on a reference chip, said electron-beam exposure device comprising:

a plurality of detectors to detect electrons scattered from said position-detection mark;

position-detection means for detecting said position of said position-detection mark by detecting positions of edges of said position-detection mark, wherein at least one of said detectors in a position to receive none of electrons scattered by a side wall of a given one of said edges is used for obtaining a position of said given one of said edges.

23. The electron-beam exposure device as claimed in claim 22, wherein said position-detection mark comprises a first groove extending in an X direction and a second groove extending in a Y direction, and said detectors comprise four detectors arranged in a +X direction, a −X direction, a +Y direction, and a −Y direction, respectively, with respect to said position-detection mark, and wherein said position-detection means comprises:

means for detecting positions of edges of said second groove by scanning said electron beam in said X direction, said positions of said edges of said second groove being detected by analyzing signal outputs of two of said detectors which are arranged in said +X direction and said −X direction; and means for detecting positions of edges of said first groove by scanning said electron beam in said Y direction, said positions of said edges of said first groove being detected by analyzing signal outputs of two of said detectors which are arranged in said +Y direction and said −Y direction.

24. A method of detecting a position of a position-detection mark in an electron-beam exposure device which has at least one deflector for deflecting an electron beam and at least one detector for detecting scattered electrons from said position-detection mark when said electron beam is positioned on said position detection mark, said position-detection mark comprising at least one groove formed on a reference chip, said method comprising the steps of:
- a) positioning said electron beam on said position-detection mark by scanning said electron beam with said at least one deflector;
- b) measuring an output of said at least one detector, said output being free from an effect of electrons scattered by a side wall of an edge of said position-detection mark; and
- c) detecting a position of said edge by analyzing an edge signal of said edge appearing in said output.

25. A method of detecting a position of a position-detection mark in an electron-beam exposure device which has at least one deflector for deflecting an electron beam and a plurality of detectors for detecting scattered electrons from said position-detection mark when said electron beam is positioned on said position detection mark, said position-detection mark comprising at least one groove formed on a reference chip, said method comprising the steps of:
- a) positioning said electron beam on said position-detection mark by scanning said electron beam with said at least one deflector;
- b) measuring outputs of said detectors, said outputs being free from an effect of electrons scattered by a side wall of an edge of said position-detection mark;
- c) adding said outputs to obtain an added output; and
- d) detecting a position of said edge by analyzing an edge signal of said edge appearing in said added output.

26. An electron-beam exposure device having at least one deflector for deflecting an electron beam within a deflection field, and detecting a position of a position-detection mark with said electron beam, said electron-beam exposure device comprising:
- a reference chip having an upper surface and a lower surface, said upper surface having a position-detection mark for calibrating a deflected position of said electron beam within said deflection field;
- a chip holder holding said reference chip by having a fixed contact with said lower surface of said reference chip, said chip holder having a step-form portion lower than said lower surface of said reference chip;
- a wafer holder having an upper surface and a first recess for storing said chip holder, said first recess having a bottom surface, an opening continuing to said upper surface, and a stopper surface located beneath said upper surface around said opening; and
- a spring provided between said bottom surface of said first recess and said chip holder to urge said step-form portion of said chip holder against said stopper surface such that said upper surface of said reference chip is flush with said upper surface of said wafer holder.

27. The electron-beam exposure device as claimed in claim 26, further comprising a wafer having another position-detection mark on an upper surface thereof for aligning said wafer with said electron beam, said electron beam being positioned on said upper surface of said wafer for drawing a pattern, wherein said wafer holder includes a second recess for storing said wafer, said upper surface of said wafer being flush with said upper surface of said wafer holder.

28. The electron-beam exposure device as claimed in claim 27, further comprising a plurality of stoppers fixedly mounted on said upper surface of said wafer holder, said upper surface of said wafer being urged against said stoppers.

29. The electron-beam exposure device as claimed in claim 28, further comprising a plurality of detectors detecting electrons scattered from one of said upper surface of said reference chip and said upper surface of said wafer, said stoppers being arranged such that said electrons scattered from said another position-detection mark on said upper surface of said wafer are free from obstruction before reaching said detectors.

30. An electron-beam exposure device having at least one deflector for deflecting an electron beam within a deflection field, and detecting a position of a position-detection mark with said electron beam, said electron-beam exposure device comprising:
- a reference chip having an upper surface and a lower surface, said upper surface having a position-detection mark for calibrating a deflected position of said electron beam within said deflection field;
- a chip holder holding said reference chip by having a fixed contact with said lower surface of said reference chip;
- a wafer holder having an upper surface and a first recess for storing said chip holder, said first recess having a bottom surface and an opening continuing to said upper surface; and
- a screw fixedly mounting said chip holder to said bottom surface of said first recess such that said upper surface of said reference chip is flush with said upper surface of said wafer holder.

31. The electron-beam exposure device as claimed in claim 30, further comprising a wafer having another position-detection mark on an upper surface thereof for aligning said wafer with said electron beam, said electron beam being positioned on said upper surface of said wafer for drawing a pattern, wherein said wafer holder includes a second recess for storing said wafer, said upper surface of said wafer being flush with said upper surface of said wafer holder.

32. The electron-beam exposure device as claimed in claim 31, further comprising a plurality of stoppers fixedly mounted on said upper surface of said wafer holder, said upper surface of said wafer being urged against said stoppers.

33. The electron-beam exposure device as claimed in claim 32, further comprising a plurality of detectors detecting electrons scattered from one of said upper surface of said reference chip and said upper surface of said wafer, said stoppers being arranged such that said electrons scattered from said another position-detection mark on said upper surface of said wafer are free from obstruction before reaching said detectors.

34. A method of exposing a predetermined pattern on a wafer by using an electron-beam exposure device which has at least one detector for detecting scattered electrons from a position-detection mark when said electron beam is positioned on said position detection mark, said method comprising the steps of;
- forming a reference chip integrally with a chip holder, said reference chip having a first position-detection mark on an upper surface thereof for calibrating a deflected position of said electron beam within a deflected field;

fixedly mounting said chip holder in a first recess of a wafer holder so that said upper surface of said reference chip is flush with an upper surface of said wafer holder;

detecting a position of said first position-detection mark by detecting electrons scattered from said first position-detection mark;

calibrating said deflected position of said electron beam within said deflected field based on said position of said first position-detection mark;

fixedly mounting said wafer in a second recess of said wafer hold, an upper surface of said wafer being urged against stoppers fixed on said upper surface of said wafer holder such that said upper surface of said wafer is flush with said upper surface of said wafer holder, said wafer having a second position-detection mark on said upper surface thereof;

detecting a position of said second position-detection mark by detecting electrons scattered from said second position-detection mark, said stoppers being arranged such that said electrons scattered from said second position-detection mark are free from obstruction before reaching said at least one detector;

aligning said wafer with said electron beam based on said position of said second position-detection mark; and drawing said predetermined pattern on said upper surface of said wafer by using said electron beam.

* * * * *